(12) United States Patent
Robin et al.

(10) Patent No.: US 11,430,373 B2
(45) Date of Patent: Aug. 30, 2022

(54) LED DISPLAY DEVICE

(71) Applicant: COMMISSARIAT A L'ENERGIE ATOMIQUE ET AUX ENERGIES ALTERNATIVES, Paris (FR)

(72) Inventors: Ivan-Christophe Robin, Grenoble (FR); Bertrand Dupont, Sassenage (FR); Stephane Caplet, Sassenage (FR); Emeric De Foucauld, Coublevie (FR); Umberto Rossini, Coublevie (FR); Alexei Tchelnokov, Meylan (FR); Francois Templier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 332 days.

(21) Appl. No.: 16/628,223

(22) PCT Filed: Jul. 3, 2018

(86) PCT No.: PCT/FR2018/051643
§ 371 (c)(1),
(2) Date: Jan. 2, 2020

(87) PCT Pub. No.: WO2019/008262
PCT Pub. Date: Jan. 10, 2019

(65) Prior Publication Data
US 2021/0142716 A1    May 13, 2021

(30) Foreign Application Priority Data
Jul. 4, 2017 (FR) ...................... 1756310

(51) Int. Cl.
*H01L 25/16* (2006.01)
*G09G 3/32* (2016.01)
(Continued)

(52) U.S. Cl.
CPC ............... *G09G 3/32* (2013.01); *H01L 24/08* (2013.01); *H01L 24/80* (2013.01); *H01L 25/167* (2013.01);
(Continued)

(58) Field of Classification Search
CPC ....... H01L 24/08; H01L 24/80; H01L 25/167; H01L 33/62; H01L 2224/08145;
(Continued)

(56) References Cited

U.S. PATENT DOCUMENTS

| | | |
|---|---|---|
| 2004/0001058 A1 | 1/2004 | Nishimura |
| 2006/0066505 A1 | 3/2006 | Nishimura |

(Continued)

FOREIGN PATENT DOCUMENTS

| | | |
|---|---|---|
| DE | 196 03 444 A1 | 8/1997 |
| WO | WO 2005/09931 A2 | 10/2005 |
| WO | WO 2017/089676 A1 | 6/2017 |

OTHER PUBLICATIONS

U.S. Appl. No. 14/779,516, filed Sep. 23, 2015, US 2016/0049544 A1, Robin, et al.

(Continued)

*Primary Examiner* — Abdul-Samad A Adediran
(74) *Attorney, Agent, or Firm* — Oblon, McClelland, Maier & Neustadt, L.L.P.

(57) ABSTRACT

A display device includes a support and first and second conductive electrical power supply elements, the first conductive element being arranged on the support. The display device also includes LED modules, each including at least one LED and two electrical power supply pads that are arranged on two opposite faces, respectively, of the LED module, one of which corresponds to an emissive face of the LED. The electrical power supply pads of each LED module are connected to the first and second conductive electrical (Continued)

power supply elements, respectively, and the connection area of an electrical power supply pad of an LED module for connection with the first conductive electrical power supply element is smaller than a receiving area of the first conductive element corresponding to the area of the first conductive element in a parallel plane to the connection areas of the power supply pads of the LED modules.

18 Claims, 15 Drawing Sheets

(51) Int. Cl.
*H01L 23/00* (2006.01)
*H01L 33/62* (2010.01)

(52) U.S. Cl.
CPC ......... *H01L 33/62* (2013.01); *G09G 2330/02* (2013.01); *H01L 2224/08145* (2013.01); *H01L 2224/80895* (2013.01); *H01L 2224/80896* (2013.01); *H01L 2924/12041* (2013.01); *H01L 2924/1426* (2013.01); *H01L 2933/0066* (2013.01)

(58) Field of Classification Search
CPC . H01L 2224/80895; H01L 2224/80896; H01L 2924/12041; H01L 2924/1426; H01L 2933/0066
See application file for complete search history.

(56) References Cited

U.S. PATENT DOCUMENTS

| | | |
|---|---|---|
| 2012/0164796 A1 | 6/2012 | Lowenthal et al. |
| 2014/0124802 A1 | 5/2014 | Do et al. |
| 2014/0267683 A1 | 9/2014 | Bibl et al. |
| 2014/0370629 A1 | 12/2014 | Lowenthal et al. |
| 2015/0249069 A1 | 9/2015 | Yoshida et al. |
| 2015/0318328 A1 | 11/2015 | Bibl et al. |
| 2015/0357315 A1 | 12/2015 | Oraw |
| 2016/0035924 A1 | 2/2016 | Oraw et al. |
| 2017/0352646 A1* | 12/2017 | Bower ................ H01L 25/167 |
| 2018/0061814 A1 | 3/2018 | Lee et al. |
| 2018/0102492 A1 | 4/2018 | Bibl et al. |
| 2018/0247922 A1 | 8/2018 | Robin et al. |

OTHER PUBLICATIONS

U.S. Appl. No. 15/545,837, filed Jul. 24, 2017, US 2018/0017961 A1, Bense, et al.
U.S. Appl. No. 15/900,505, filed Feb. 20, 2018, US 2018/0240843 A1, Mainguet, et al.
U.S. Appl. No. 15/769,962, filed Apr. 20, 2018, US 2018/0315738 A1, Bono, et al.
U.S. Appl. No. 16/064,759, filed Jun. 21, 2018, US 2019/0005296 A1, Mainguet, et al.
U.S. Appl. No. 16/021,975, filed Jun. 28, 2018, US 2019/0004413 A1, Templier, et al.
U.S. Appl. No. 16/114,324, filed Aug. 28, 2018, US 2019/0074398 A1, Kadura, et al.
U.S. Appl. No. 16/096,534, filed Oct. 25, 2018, US 2019/0157505 A1, Even, et al.
U.S. Appl. No. 16/179,355, filed Nov. 2, 2018, US 2019/0140008 A1, Chambion, et al.
U.S. Appl. No. 16/375,422, filed Apr. 4, 2019, US 2019/0311681 A1, Dupont, et al.
U.S. Appl. No. 16/514,079, filed Jul. 17, 2019, Porte, et al.
International Search Report dated Sep. 27, 2018 in PCT/FR2018/051643 filed Jul. 3, 2018.
French Preliminary Search Report dated Apr. 26, 2018 in Patent Application No. 1756310 filed Jul. 4, 2017, 2 pages.

* cited by examiner

LED DISPLAY DEVICE

TECHNICAL FIELD AND PRIOR ART

The field of the invention relates to display or image projection devices. It notably relates to the production of a screen including LEDs or micro-LEDs (μLEDs) advantageously made of GaN.

The large majority of current screens are produced with liquid crystals coupled to a back-lighting and are named LCD (Liquid Crystal Display) screens. A liquid crystal matrix of such a screen is driven by TFTs (Thin Film Transistors).

Another technology for more efficient screens is OLED (Organic Light Emitting Diode) technology. The pixel command principle is similar to that used in the case of an LCD screen (command circuit produced using TFT technology).

It is also possible to use micro-LEDs (or μLEDs) including for example a structure based on GaN/InGaN. These μLEDs make it possible to have reduced consumption (efficiency of GaN/InGaN μLEDs greater than 60%) compared to LCD and OLED screens. These μLEDs are compatible with high current densities, which makes it possible to have high luminances, typically $10^6$ cd/m$^2$.

The document FR 3 044 467 describes a method for manufacturing a screen by assembly of micro-chips constituted of μLEDs and their command electronics. With this method, the command electronic may be produced using bulk technology and not TFT technology. This method has however the drawback of having to carry out a very precise transfer of the micro-chips, which each include four connections, on an interconnection network, which is complicated to carry out given the required precision. The duration necessary to carry out this transfer is also very important on account of the number of μLEDs having to be transferred.

DESCRIPTION OF THE INVENTION

An aim of the present invention is to propose a display device of which the architecture allows a relaxation of the constraints relative to the transfer and to the positioning of the LEDs with respect to the interconnections to which the LEDs are connected.

To do so, a display device is proposed including at least:
a support;
first and second power supply conductive elements, said at least one first conductive element being arranged on a face of said support;
several LED modules each comprising at least one LED, each LED comprising at least two layers forming a p-n junction, and each LED module including two power supply pads arranged respectively on two opposite faces of the LED module of which one corresponds to an emissive face of the LED of said LED module,
in which, the power supply pads of each LED module are connected respectively to the first and second power supply conductive elements, for the power supply of the LED module, and
in which, the connection surface of a power supply pad of an LED module with the first power supply conductive element is significantly smaller than a host surface of the first conductive element corresponding to the surface of the first conductive element in a plane parallel to the connection surfaces of the supply pads of the LED modules and capable of the production of an electrical contact with a power supply pad of an LED module.

A display device is also proposed including at least:
a support;
first and second power supply conductive elements, said at least one first conductive element being arranged on a face of said support;
several LED modules each comprising at least one LED, each LED comprising at least two layers forming a p-n junction, and each LED module including two power supply pads arranged respectively on two opposite faces of the LED module of which one corresponds to an emissive face of the LED of said LED module,
in which, the power supply pads of each LED module are connected respectively to the first and second power supply conductive elements, for the power supply of the LED module, and
in which the ratio of dimensions between a host surface of a display pixel zone, in which one or more LED modules belonging to this zone are intended to produce a display of a light point of the display device and formed by the first conductive element, and the connection surface of a power supply pad of one of the LED modules with the first conductive element is greater than or equal to 2.

In such a device, given the important dimensions of the host surface compared to those of the supply pads, it is not necessary to achieve a precise positioning of the LED modules on the host surface of the first conductive element. Different ways of transferring the LED modules onto this host surface may thus be envisaged, such as for example producing a random arrangement of the LED modules on the host surface. It is not necessary to achieve an alignment of the pixel modules vis-à-vis the conductive elements to which the LED modules are electrically connected.

The LED modules may be positioned or transferred onto the host surface of the first conductive element in a non-deterministic manner. A non-deterministic positioning or transfer here signifies substantially random. A non-deterministic transfer may thereby lead to a variable, and thus non-uniform, density of the LED modules on a support. Moreover, the density of LED modules at a given location often cannot not be predetermined in advance and will be for example dictated by a statistical probability law of Poisson law type.

The LED modules may be positioned or transferred onto the host surface of the first conductive element in an unconstrainted or de-constrained manner. An unconstrained or de-constrained positioning or transfer signifies that the conductive supply pads of the LED modules have contact surfaces of dimensions less than those of the conductive host surfaces of the support on which are transferred the LED modules, for example with a ratio at least equal to 2 or at least equal to 5, such that the precision of positioning the LED modules by the positioning method may have a relaxed, or even very relaxed, precision, the LED module being able to be positioned at different locations of the host surface, without it being necessary to ensure centring of the pads of the LED module on the conductive host surfaces. In this case, the density of LED modules could be substantially uniform for the different conductive host surfaces, but the positioning of the LEDs on a host surface could fluctuate and the term pseudo-random positioning on the conductive host surfaces could thereby be used.

Furthermore, the orientation of the modules during their transfer could be random or not, depending on whether a technique of pre-orientation of the LED modules is used or not, before or during the operation of transfer onto the support.

The term LED is used to designate an LED or a μLED.

A ratio between the dimensions of the host surface of the first conductive element and those of the connection surface of a power supply pad of an LED module, in the plane formed at the interface of the host surface and the connection surface, may be greater than or equal to 2, or greater than or equal to 5.

The host surface of the first conductive element corresponds to all of the surface of conductive material of the first conductive element which can serve to produce the electrical contact with the power supply pads of the LED modules. A conductive material which could not serve to form the electrical connection with the LED modules does not form part of this host surface.

The LED modules may be distributed in a random or quasi-random manner on the host surface of the first conductive element, the device being able to result from the implementation of the method described below.

The LED modules may be distributed in a random manner, such that the density of LED modules on the host surface is non-uniform.

The ratio of dimensions between the host surface of the first conductive element and the connection surface of a supply pad of one of the LED modules is greater than or equal to 2, or greater than or equal to 5.

Each LED module may further comprise a command circuit of the LED of said LED module, the command circuit being capable of outputting, on one of the layers of the p-n junction of the LED, a signal representative of the light signal intended to be emitted by the LED.

The command circuits may be capable of carrying out a PWM (pulse width modulation) demodulation of the light signal intended to be transmitted on the power supply conductive elements, or a demodulation of a binary signal representative of the light signal intended to be transmitted on the power supply conductive elements.

The demodulation may be of PWM or BCM (Binary Code Modulation) type.

Each of the first and second power supply conductive elements may comprise several conductive tracks extending substantially parallel with each other, the conductive tracks of the first power supply conductive element extending substantially perpendicularly to the conductive tracks of the second power supply conductive element. In this case, the region corresponding to the superimposition of one of the conductive tracks of the first conductive element with one of the conductive tracks of the second conductive element can form a display pixel zone in which the LED module(s) belonging to this display zone are intended to produce the display of a light point of the device, and form for example a pixel of the display device.

Each of the first and second power supply conductive elements may comprise a single electrically conductive plane, or a single electrically conductive layer.

Each LED module may comprise two LEDs arranged head-to-tail one next to the other.

The display device may further comprise:
a display plane including several display pixel zones, each display pixel zone including at least one of the LED modules and a control device of said at least one of the LED modules of said display pixel zone as a function of a command signal of said display pixel zone intended to be received by the control device;
an input/output interface of the display device, capable of receiving an image signal intended to be displayed on the display plane and including at least one command unit intended to output the command signals of the display pixel zones;

in which:
the command unit is connected to at least one first antenna capable of transmitting by RF waves the command signals of the display pixel zones;
each control device includes at least one second antenna coupled to an RF signal processing circuit and is capable of receiving the command signal of the associated display pixel zone and of commanding said at least one of the LED modules of the display pixel zone as a function of the command signal received to emit a light signal corresponding to a part of the image signal associated with said display pixel zone.

In such a display device, forming for example a µLED screen, the control devices that command the LED modules are no longer linked in a wired manner to the command unit(s) that process the image signal received by the display device. Such a configuration makes it possible to decorrelate the transport of the power supply signals vis-à-vis the command signals of the LED modules, which avoids the transport of command signals in the conductive elements which can have important dimensions causing too high attenuations.

Moreover, this architecture provides greater flexibility in the association between the display elements (LED modules and control devices) and the signal processing elements upstream of the display (command unit(s)). Thus, it is possible to modify easily the association of these different elements with each other.

The control device may drive the LED modules from the signals received on the second antenna even when the LED modules do not include command circuits.

Each of the LED modules may comprise a control device, or each display pixel zone may comprise several LED modules and a common control device electrically connected to the LED modules of said display pixel zone.

The second antennas may be arranged in a same plane as one of the two power supply conductive elements.

Each control device may be arranged between the two power supply conductive elements and supplied by said power supply conductive elements.

It is thus possible to implement a method for displaying an image on a display device, including at least:
a reception of an image signal intended to be displayed on a display plane of the display device;
a processing of the image signal by at least one command unit of the display device to determine the command signals of several display pixel zones of the display device such that each display pixel zone includes at least one LED module including at least one LED,
a sending by RF waves of the command signals to the display pixel zones;
a reception of each command signal by a control device of each display pixel zone;
a command of the LED module of each display pixel zone by said control device as a function of the command signal received to emit a light signal corresponding to a part of the image signal associated with said display pixel zone.

A method is also proposed for producing a display device including at least:
producing several LED modules each comprising at least one LED and at least two power supply pads arranged at two opposite faces of the LED module of which one corresponds to an emissive face of the LED of said LED module;
producing a support with at least one first power supply conductive element arranged on a face of the support;

transferring the LED modules onto the support such that the first power supply conductive element forms, for at least one part of the LED modules, at least one host surface, against which one of the power supply pads of each of said LED modules is arranged to produce an electrical contact, the connection surface of a supply pad being significantly smaller than said host surface;

producing at least one second power supply conductive element on the LED modules such that the LED modules are arranged between the first and second power supply conductive elements and that the two power supply pads are connected respectively to the first and second power supply conductive elements.

A method for producing a display device is also proposed including at least:

producing several LED modules each comprising at least one LED and at least two power supply pads arranged at two opposite faces of the LED module of which one corresponds to an emissive face of the LED of said LED module;

producing a support with at least one first power supply conductive element arranged on a face of the support;

transferring the LED modules onto the support such that the first power supply conductive element forms, for at least one part of the LED modules, at least one host surface of a display pixel zone in which one or more LED modules belonging to this zone are intended to produce a display of a light point of the display device, against which one of the power supply pads of each of said LED modules is arranged to produce an electrical contact, the ratio of dimensions between said host surface and the connection surface of a power supply pad of one of the LED modules with the first conductive element is greater than or equal to 2;

producing at least one second power supply conductive element on the LED modules such that the LED modules are arranged between the first and second power supply conductive elements and that the two power supply pads are connected respectively to the first and second power supply conductive elements.

During the step of transfer of the LED modules, the positioning of the LED modules may be carried out in a random or quasi-random manner on said at least one host surface of the first conductive element.

The dispersion of the LED modules on the host support may be random and may comprise a projection by spray of the LED modules, or a suspending of the LED modules in a solution then a sedimentation of the LED modules on the host support and a removal from the medium of the solution in which the LED modules have been dispersed.

In an alternative, the transfer of the LED modules may be implemented in a pseudo-random manner using a transfer machine capable of transferring simultaneously several LED modules onto a part of the host support.

The production of each of the first and second power supply conductive elements may comprise the deposition by printing of several conductive tracks extending substantially parallel with each other, the conductive tracks of a first of the two power supply conductive elements extending substantially perpendicularly to the conductive tracks of a second of the two power supply conductive elements.

The method may further comprise, between the transfer of the LED modules and the production of the second power supply conductive element, the implementation of the following steps:

deposition of a photosensitive resin covering the LED modules and the parts of the host support located on the side of the LED modules and not covered by the LED modules;

exposure of the sensitive resin through the host support which is transparent vis-à-vis the wavelength used for this exposure;

development of the exposed resin such that the remaining exposed parts of the photosensitive resin are kept between the LED modules and form passivation elements between the LED modules.

The LED modules may be produced such that they each comprise at least one micro-magnet and/or such that the side faces of the LED modules are etched such that, during the dispersion of the LED modules on the host support, an arrangement of the LED modules such that the emissive face of the LED is arranged on a side of the host support which is optically transparent is favoured.

BRIEF DESCRIPTION OF THE DRAWINGS

The present invention will be better understood on reading the description of exemplary embodiments given purely for indicating purposes and in no way limiting and by referring to the appended drawings in which.

Identical, similar or equivalent parts of the different figures described hereafter bear the same numerical references in order to make it easier to go from one figure to the next.

The different parts in the figures are not necessarily shown according to a uniform scale, in order to make the figures more legible.

The different possibilities (alternatives and embodiments) should be understood as not being mutually exclusive and may be combined together.

Detailed Description of Particular Embodiments

A display device produced by transfer of LEDs in a non-deterministic, random or pseudo-random manner onto a transfer support (for example a plate containing TFT components or a non-functionalised support plate) is proposed here. The transfer support includes at least one conductive track corresponding for example to the future lines or columns of a future matrix.

Figure 1:
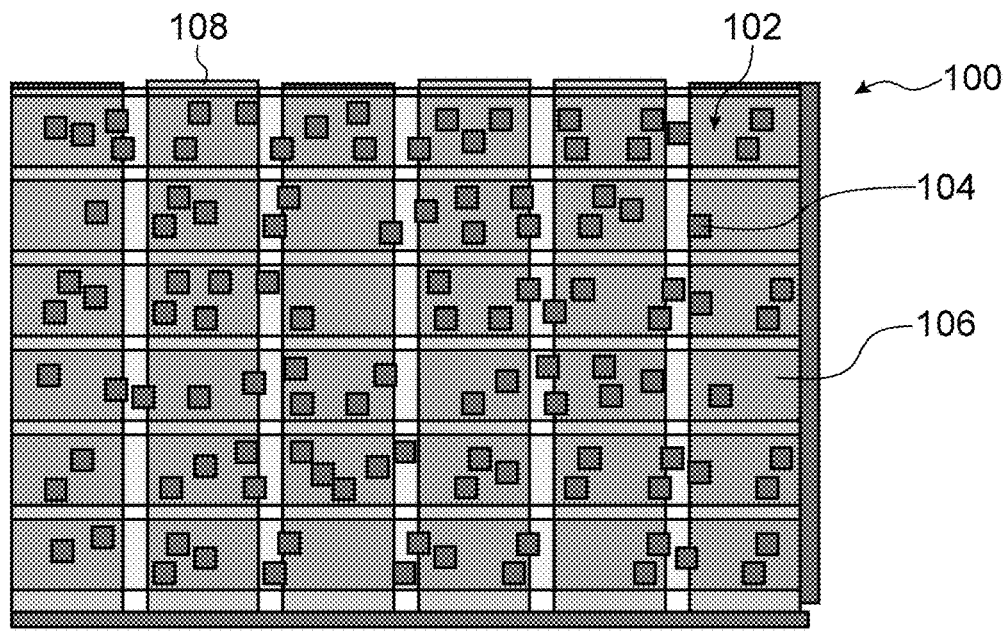
FIG. 1 schematically shows a part of a display device, subject matter of the present invention, according to a first embodiment.

Reference is firstly made to FIG. 1 which schematically shows a display device 100 according to a first embodiment.

The device 100 forms a matrix of n×m display pixel zones 102. A display pixel zone 102 corresponds to a region of a display plane of the device 100 intended for the display of a point image commanded individually with respect to the other image points of the display plane. Each display pixel zone 102 comprises one or more LED modules 104 ensuring the light emission of this display pixel zone 102 (a defective display pixel zone may however comprise no LED module, as is described hereafter). All the LED modules 104 present in a same display pixel zone operate concurrently to display the corresponding image point. In the first embodiment described here, each display pixel zone 102 corresponds to a pixel of the display plane. In FIG. 1, only a part of this matrix of pixels is shown and corresponds to a set of 36 pixels distributed on 6 lines and 6 columns of pixels.

Figure 2:
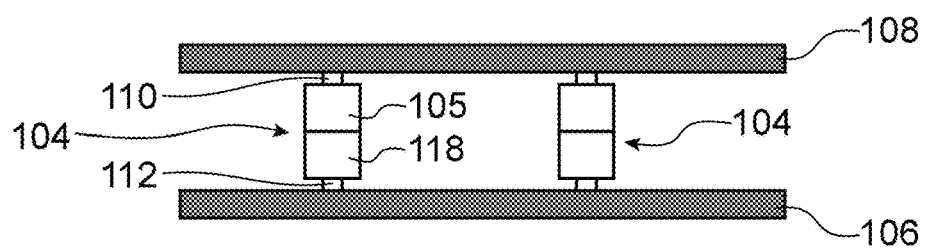
FIG. 2 schematically shows the LED modules of a display device according to the invention.

The LED modules 104 each include an LED 105 and an electronic command circuit 118. The LEDs 105 are made for example of at least one inorganic semiconductor, advantageously GaN and/or InGaN and/or AlGaN. As may be seen in FIG. 2, each LED module 104 comprises on one side the LED 105, and on the other the electronic command circuit 118. The dimensions of each LED module 104, in a plane parallel to the interface between the electronic command circuit 118 and the LED 105, are for example comprised, in the case of microLED modules, between around 1 µm and 100 µm, or between around 5 µm and 100 µm, as a function notably of the bulk of the electronic command circuit 118 which is going to depend on its complexity, that is to say the number and the type of functions implemented by this circuit 118. The thickness of each LED module 104 is for example between around 2 µm and 10 µm.

The LEDs 105 may emit either a light of variable colour, or instead emit a monochromatic light. When monochromatic LEDs 105 are used, different LEDS 105 emitting light of red, green and blue colour (and optionally white) are preferably transferred in order to have in each pixel at least one LED 105 of each of these colours (except in the defective display pixel zones 102).

The LED modules 104 are here distributed in a random manner, within display pixel zones 102 of the device 100. The density with which the LED modules 104 are distributed is such that statistically each display pixel zone 102 comprises at least one LED module 104 except for a limited number of zones 102. Each zone 102 may however comprise several LED modules 104.

Each LED module 104 comprises two power supply pads 110, 112 connected to power supply conductive elements 106, 108 of the device 100. As may be seen in FIG. 2, the LED 105 of each LED module 104 and the electronic command circuit 118 of each LED module 104 are both connected, via the pad 110, to one of the conductive elements 108 and connected, via the pad 112, to one of the conductive elements 106. The conductive elements 108 are optically transparent or semi-transparent in order to enable the light emission of the LEDs 105.

In FIG. 1, the conductive elements 106 are produced in the form of electrically conductive lines extending along a first direction (horizontally in FIG. 1), and the conductive elements 108 form electrically conductive columns extending along a second direction substantially perpendicular to the first direction (vertically in FIG. 1).

A power supply potential, named $V_{supp}$, is for example intended to be applied on the conductive elements 106 and a reference electrical potential (for example ground), named $V_{ground}$, is intended to be applied on the conductive elements 108. Within each zone 102, each of the LED modules 104 is thus connected to this supply potential and to the reference potential.

A screen is thus here proposed produced by transfer of LEDs transferred for example in a non-deterministic manner onto a transfer support. The transfer support may correspond to a plate on which are formed one of the conductive elements 106, 108 in the form of lines or columns as is the case in the first embodiment described above. The transfer support may also correspond to a TFT plate including electronic command elements.

This particular transfer of the LED modules 104 is possible thanks to the important dimensions of the host surfaces or contact surface of the LED modules 104, that is to say the dimensions of the electrically conductive elements 108, compared to those of the LED modules and more particularly the dimensions of the conductive pads present on each LED module and intended to enable the supply of the LED module. Indeed, given that the dimensions of these electrically conductive elements are indeed much larger than those of the LED modules 104 and thus also the power supply pads 110, 112 vis-à-vis the contact surfaces of the electrically conductive elements 108, it is not necessary to achieve a precise positioning of the LED modules 104 on these host surfaces. These dimensions are such that in a plane parallel to the contact surfaces, a ratio between the dimensions of one of the contact surfaces on the support and those of one of the two opposite faces of one of the LED modules is greater than or equal to 2, or greater than or equal to 5, or even greater than or equal to 10. The contact surface on the support corresponds to the surface available to produce the electrical contact with one of the LED modules 104, this surface optionally being able to be partially apertured or constituted of different surfaces electrically connected and at a same potential.

The steps of a method for producing the device 100 are described in relation with FIGS. 3A to 7B.

Figure 3A:
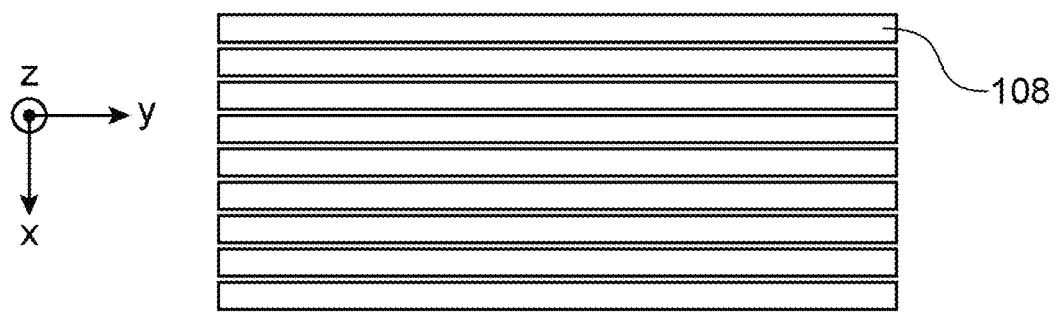
FIGS. 3A to 7B show the steps of a method for producing a display device according to the invention.
Figure 3B:
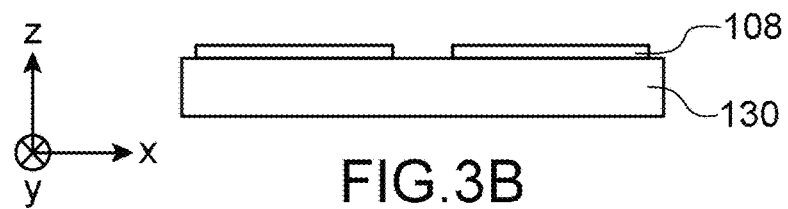

A first electrode level is firstly produced (FIGS. 3A and 3B). In the example described here, they are conductive elements 108 intended to be on the side of the emissive faces of the LEDs 105. A transparent support 130 is used, for example made of glass. Strips of ITO are next etched at the pitch corresponding to the desired pitch of the display pixel zones 102, preferably by laser etching of inter-strip zones from a continuous plane, or continuous layer, of ITO. These strips of ITO form the conductive elements 108.

The LED modules 104 are ideally suspended in a water-IPA mixture and maintained in suspension by ultrasonic agitation. The equipment may advantageously be of the type of those used for liquid crystal screens, for the random dispersion of the spacers.

Figure 4A:
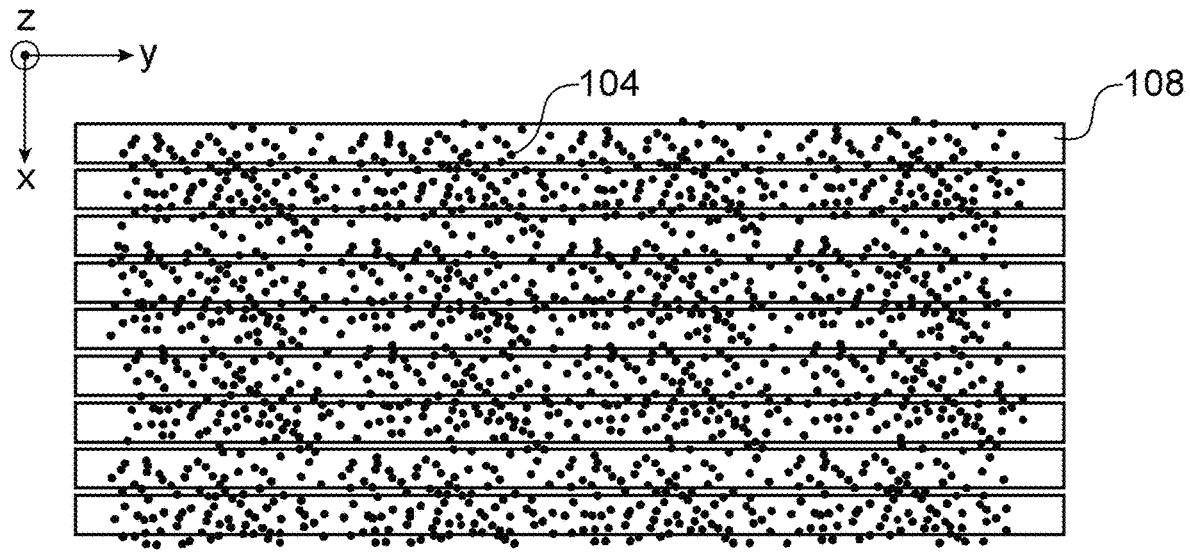
Figure 4B:
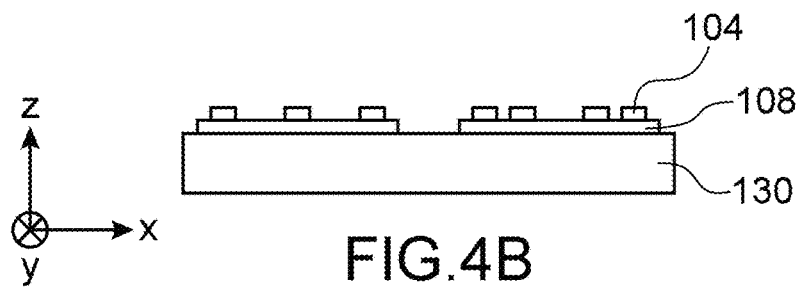

The LED modules 104 are next dispersed randomly for example by spray so as to minimise the number of defective zones 102 on the conductive elements 108 (FIGS. 4A and 4B). For a screen of $1.10^6$ pixels or zones 102, a volume of solution containing of the order of $1.10^7$ LED modules 104 is dispensed, which must ensure a level of defects of the order of 10. A direct metal—metal bonding may be carried out to ensure the connection of the LED modules 104 with the conductive elements 108.

Figure 5:
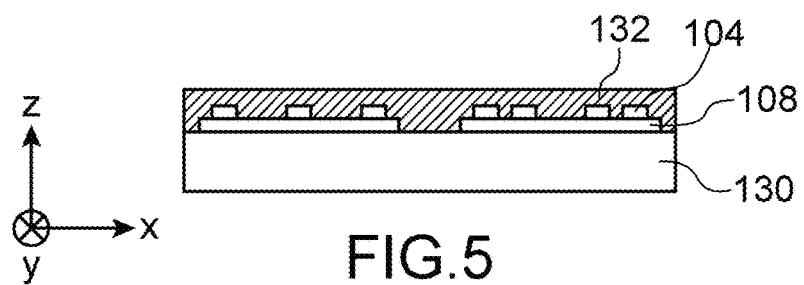

A negative type insulating resin 132 is distributed on the whole of the structure produced, preferably by spray and of a thickness preferably greater than the thickness of the LED modules 104 (FIG. 5). This resin is advantageously of black colour in order to obtain good contrast with the LEDs 105 during emission of light with non-zero emission of ambient light, as well as having a display plane of black colour when the LEDs 105 do not emit light.

Figure 6:
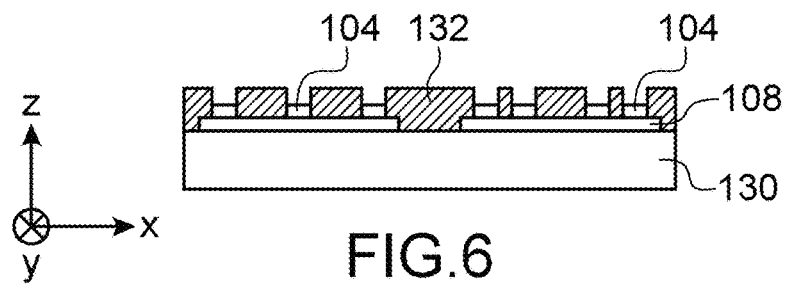
Figure 7A:
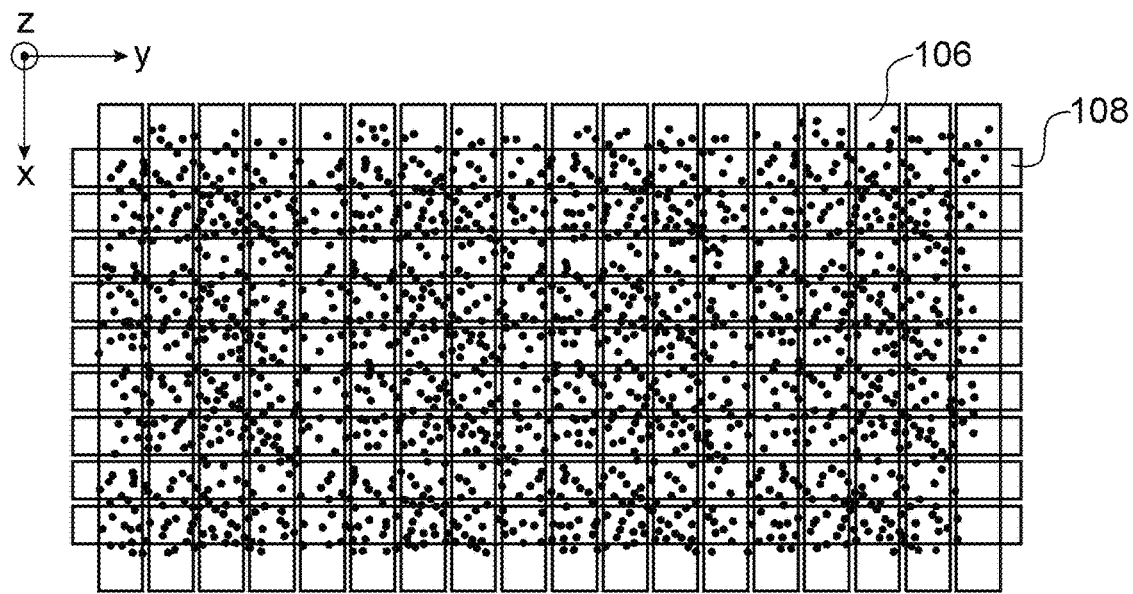
Figure 7B:
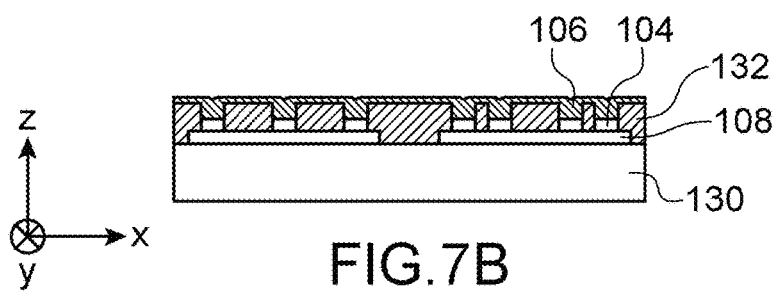

An exposure through the transparent support 130 and the conductive elements 108 makes it possible to expose the resin 132 between the LED modules 104 and not the resin present on the LED modules 104. A development of the resin 132 next makes it possible to remove the non-exposed resin present on the LED modules 104 (FIG. 6). The remaining portions of the resin ensure a passivation between the LED modules 104.

Finally, the other conductive elements 106 are produced for example by printing of metal electrodes (perpendicular to the preceding electrodes). The resin 132 deposited at the preceding step then ensures a smoothing role favouring the deposition of the conductive elements 106 by printing.

Figure 15:
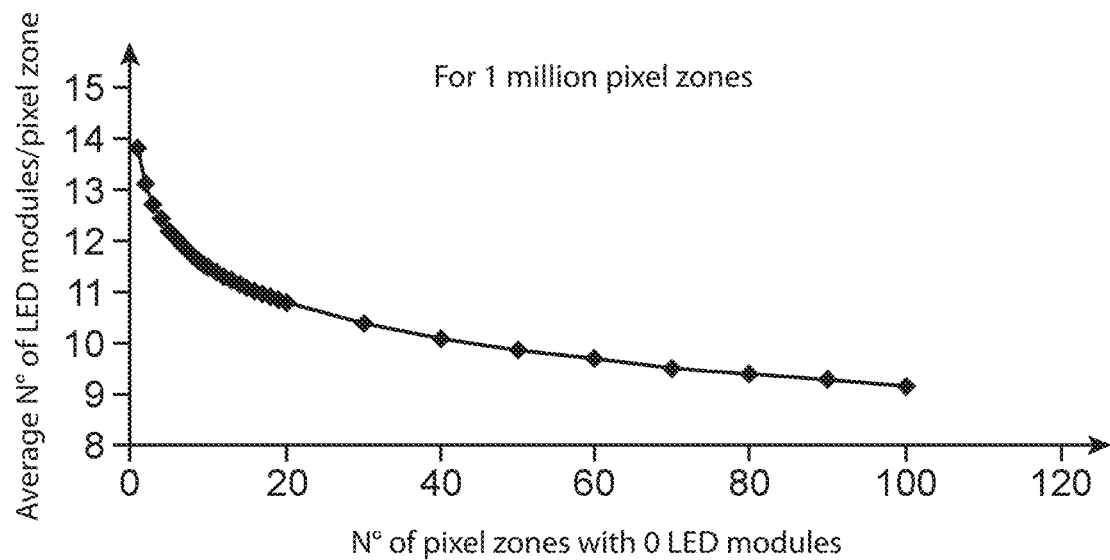
FIGS. 15 and 16 show simulation curves of random dispersion of the LED modules.
Figure 16:
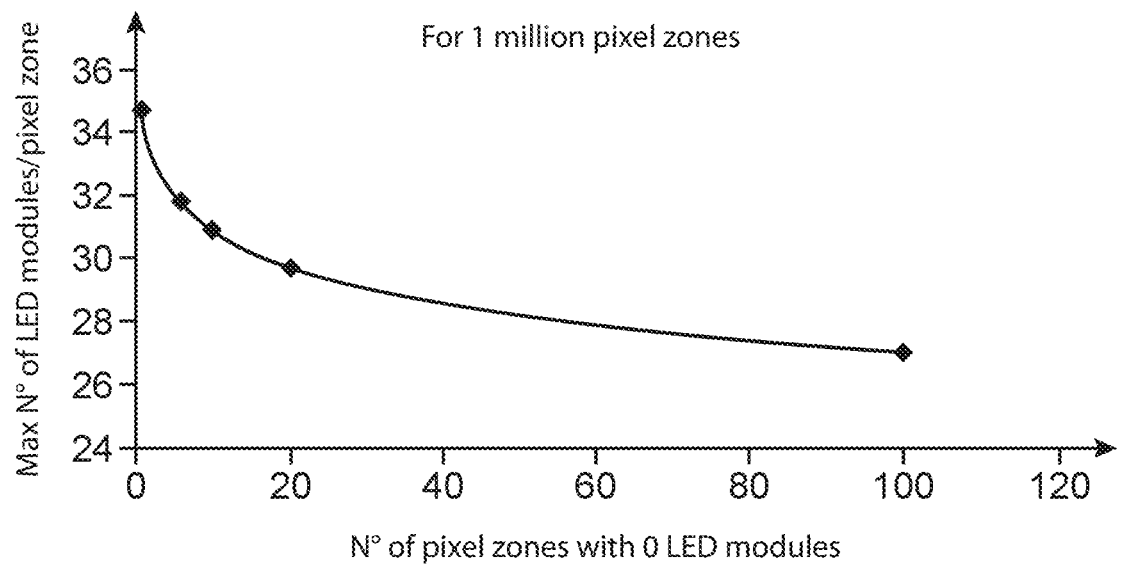

In this process of random dispersion of the LED modules 104, the distribution follows a Poisson law. Taking the hypothesis of a number of display pixel zones 102 of $1.10^6$ and using Poisson's law, it is possible to evaluate the number of LED modules 104 that it is necessary to dispense as a function of the number of defects that is accepted for the device 100. Defect is taken to mean a display pixel zone 102 where there is no LED module 104 or no functional LED module 104. In the graph shown in FIG. 15, considering a million display pixel zones 102, it is necessary to dispense of the order of 14 million LED modules 104 on the host support to have only a single defective display pixel zone 102 (the average number of LED modules 104 per pixel zone then being 14). By dispersing 10 million LED modules, around 45 defective display pixel zones 102 are obtained. It is also possible to estimate the maximum number of LED modules 104 that can be located in a display pixel zone 102 as a function of the number of accepted defects. Thus, in FIG. 16, by accepting a single defective display pixel zone 102, it is possible to find a display pixel zone 102 including 35 LED modules 104.

In the method described below, the LED modules 104 are distributed thanks to a dispersion by spray on the support 130 and the conductive elements 108. In an alternative, it is possible to place the LED modules 104 in a liquid to obtain a colloidal suspension of the LED modules 104. This suspension is distributed on the support 130 and the conductive elements 108 then, by sedimentation and next drawing up of the medium in which the LED modules 104 are located, the LED modules 104 are arranged on the conductive elements 108.

Figure 8:
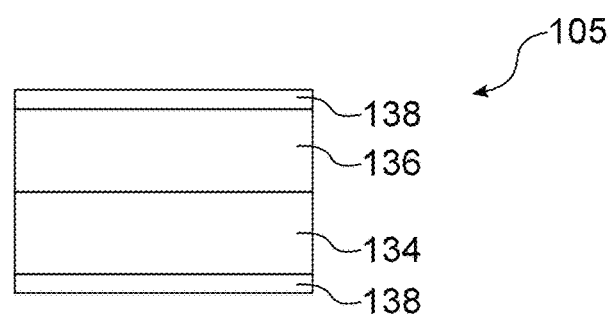
FIG. 8 shows an example of µLED of a display device according to the invention.

The LEDs 105 of the LED modules 104 are for example like that shown in FIG. 8. This LED 105 comprises a layer 134 of n doped semiconductor arranged against a layer 136 of p doped semiconductor, this stack forming a p-n junction being arranged between two conductive layers 138 including for example ITO (transparent to enable the light emission of the LED 105). The semiconductor of the layers 134, 136 is for example GaN. The layers 138 facilitate the contact with the conductive elements 106, 108.

By distributing in a random manner the LED modules 104 on the support, some of these LED modules 104 are not arranged in the right sense, that is to say comprise their luminous face which is not on the right side of the display plane. However, given the large number of LED modules 104 dispersed, statistically a sufficient number of correctly oriented LED modules 104 is obtained. The inversed LED modules 104 do not pose an electrical problem because, when powered, these LED modules 104 form reversed biased diodes not disrupting the operation of the other correctly oriented LED modules 104. When each LED module 104 comprises a command circuit 118 of CMOS type, the CMOS architecture of this circuit 118 is such that a reverse biasing does not create a short-circuit.

In the embodiment described above, the dispersed LED modules 104 comprise an LED 105 and a command circuit 118. In an alternative, it is possible that the LED modules 105 do not include a command circuit 118, but uniquely one or more LEDs 105.

Figure 9:
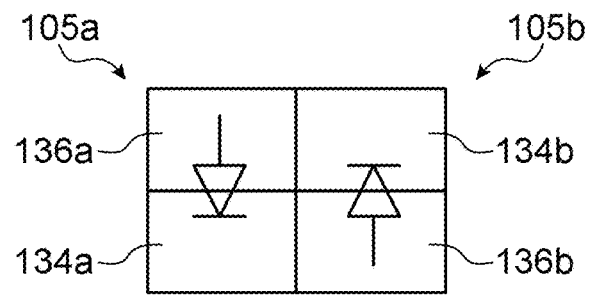
FIG. 9 schematically shows an LED module comprising two LEDs mounted head-to-tail.

Advantageously, it is possible that each LED module 104 comprises two LEDs 105 arranged head-to-tail one next to the other. Such a configuration is shown in FIG. 9 in which, at a first face, a first LED 105a comprises the n doped layer 134a and a second LED 105b comprises the p doped layer 136b, and at a second face opposite to the first, the first LED 105a comprises the p doped layer 136a and the second LED 105b comprises the n doped layer 134b. Thus, one of the LEDs 105 will be functional whatever the face (first or second) that is in contact with one of the conductive elements 108.

Figure 10:
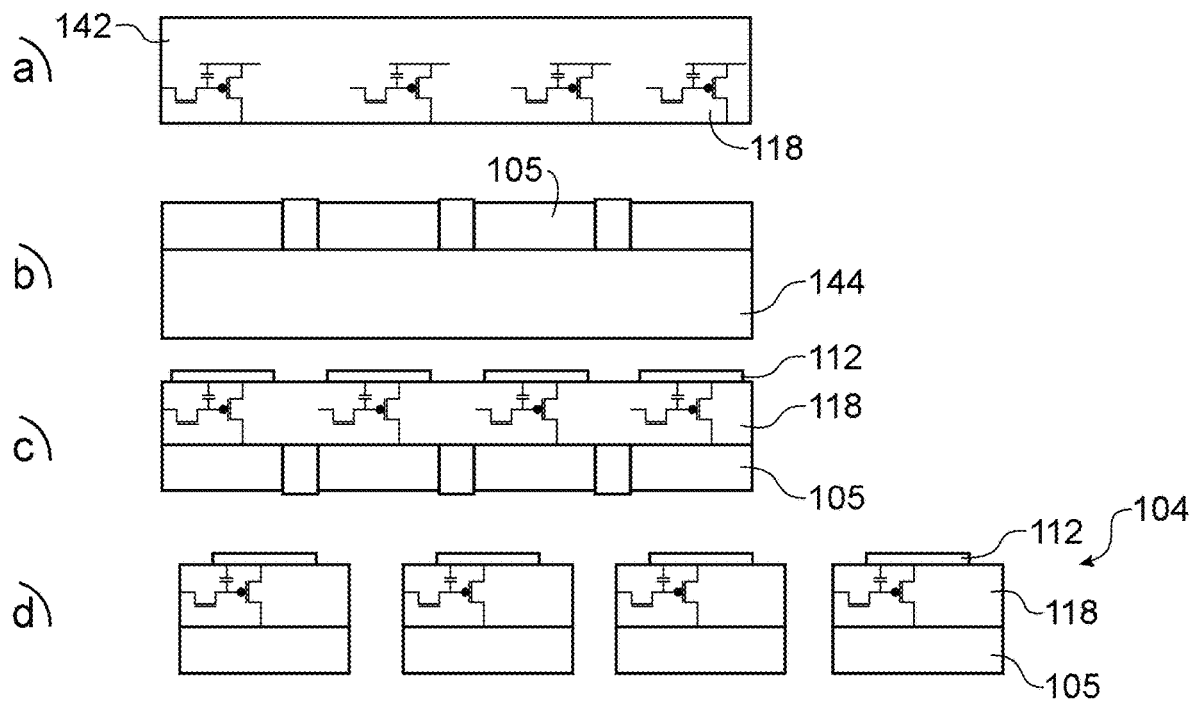
FIG. 10 shows a method for producing LED modules.

An example of method for producing LED modules 104 is described in relation with FIG. 10.

At step a) of this figure, a matrix of electronic command circuits 118 is produced using CMOS technology in a semiconductor substrate 142, for example silicon.

Parallel to the production of the matrix of electronic command circuits 118, a matrix of LEDs 105 is produced from another semiconductor substrate 144, for example by epitaxy (step b)).

The matrix of electronic command circuits 118 is next transferred onto the matrix of LEDs 105. Contact pick-ups between the electronic command circuits 118 and the LEDs 105 are produced during this assembly. The semiconductor of the substrate 142 is next thinned then the pads 112 are next produced on the side of the command circuits 118. The growth substrate 144 is next removed (step c)).

An etching and a singularisation of the LED modules 104 are next implemented (step d)). These LED modules 104 can next be arranged in solution.

Figure 11:
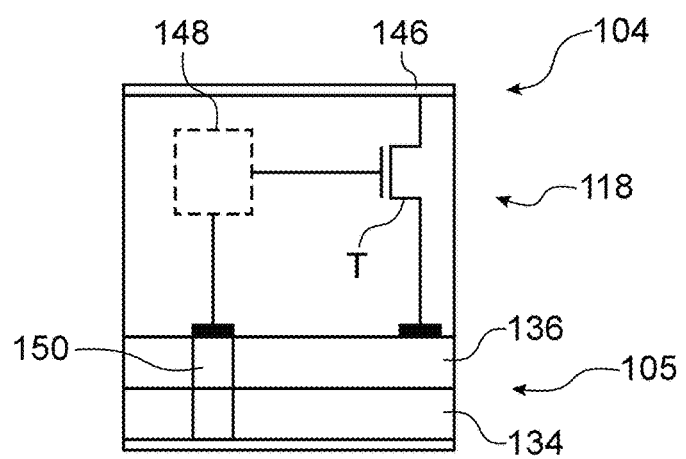
FIG. 11 schematically shows an electronic command circuit of an LED module.

An exemplary embodiment of the electronic command circuit 118 is shown in FIG. 11. This circuit comprises a MOS transistor T connected between a contact 146, for example of ITO, intended to be connected to the conductive element 106, and the LED 105. The gate of the transistor T is connected to the contact 146. The circuit 118 also comprises a part CMOS 148 not detailed here and intended for the processing of the data signals intended to be received by the LED module 104 and the driving of the transistor T electrically supplying the LED 105. This part 148 may correspond to a simple CMOS transistor when no function other than the power supply of the LED 105 is fulfilled by the circuit 118. This part 148 is connected to a second contact 150, for example of ITO, intended to be connected to the conductive element 108 and located on the side of the emissive face of the LED 105. The contact 150 is connected to the part 148 through a conductive via 152 which is electrically isolated vis-à-vis the semiconductor layers 134 and 136 of the LED 105.

During the dispersion of the LED modules 104, it is advantageous to favour the positioning of the LED modules 104 in the proper direction, that is to say to have the LED modules 104 oriented such that the emissive faces of the largest number of LEDs 105 are turned towards the display face of the device 100. It will henceforth be necessary to use a technique of pre-orientation of the LED modules before/during their transfer onto the support.

Figure 12:
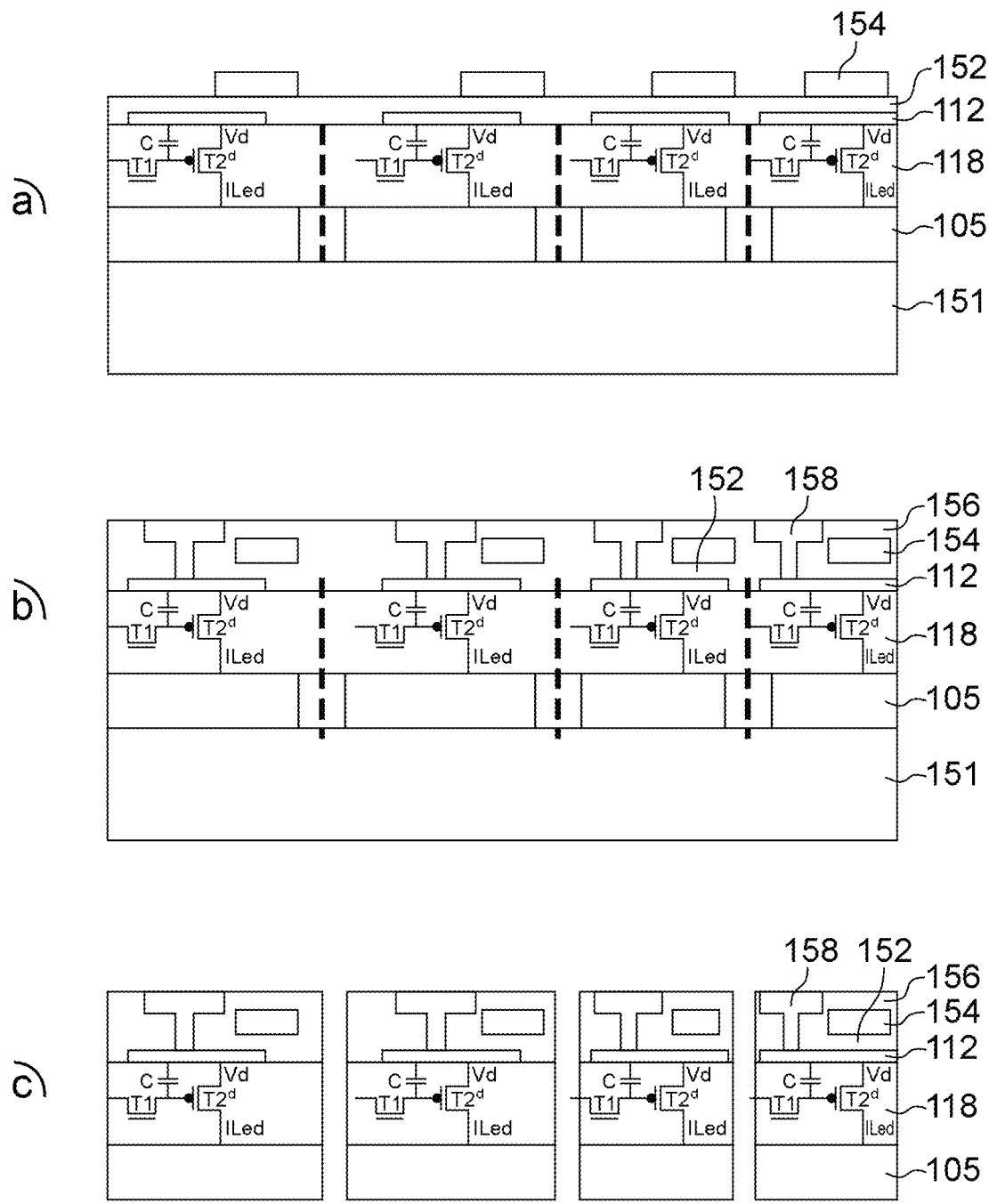
FIG. 12 shows the steps of a method for producing LED modules with pre-orientation.

A first solution for favouring this correct orientation may be to incorporate micro-magnets within the LED modules 104. These micro-magnets may serve to assemble thereafter the LED modules 104 of the correct side during a random placement of the LED modules 104. For example, by repeating the method described previously in relation with FIG. 10, at the end of step c), a dielectric 152 such as $SiO_2$ is deposited on the face comprising the pads 112. A temporary handle 151 is made integral with the LEDs 105, the bonding of this temporary handle 151 being able to be carried before the thinning of the substrate 142. A planarization of this dielectric 152 is next implemented, then micro-magnets 154 are arranged on this planarized dielectric, distributed such that at least one micro-magnet 154 is associated with each LED module 104 (see FIG. 12, step a). The micro-magnets 154 are covered with a dielectric layer 156, for example of same nature as the dielectric 152, then a contact pick-up of the pads 112 is produced through this dielectric layer 156 and the dielectric 152 through conductive vias 158 formed for example by a Damascene method (FIG. 12, step b)). A singularisation of the LED modules 104 by etching of the stack produced is next implemented, the temporary handle 151 being removed (FIG. 12, step c)). Thus, the Damascene method makes it possible to prepare a surface compatible with a direct bonding. By thereby integrating micro-magnets 154 within the LED modules 104, the positioning of these LED modules 104 is influenced because the micro-magnet 154 is attracted on the side of the conductive elements 106, thereby favouring the correct positioning of the emissive faces of the LEDs 105.

Figure 13A:
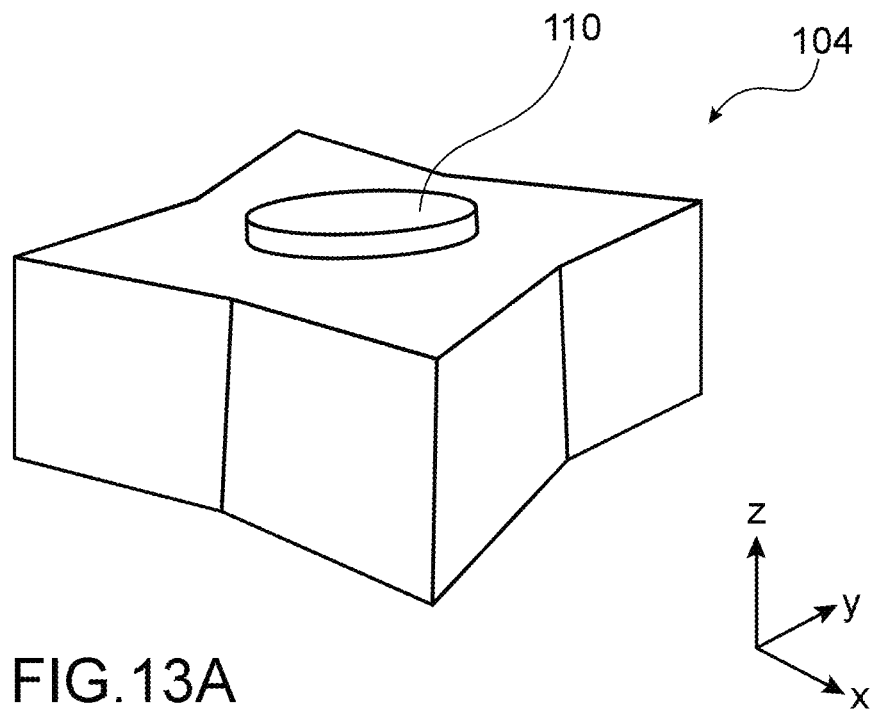
FIGS. 13A and 13B schematically show an LED module with pre-orientation.
Figure 13B:
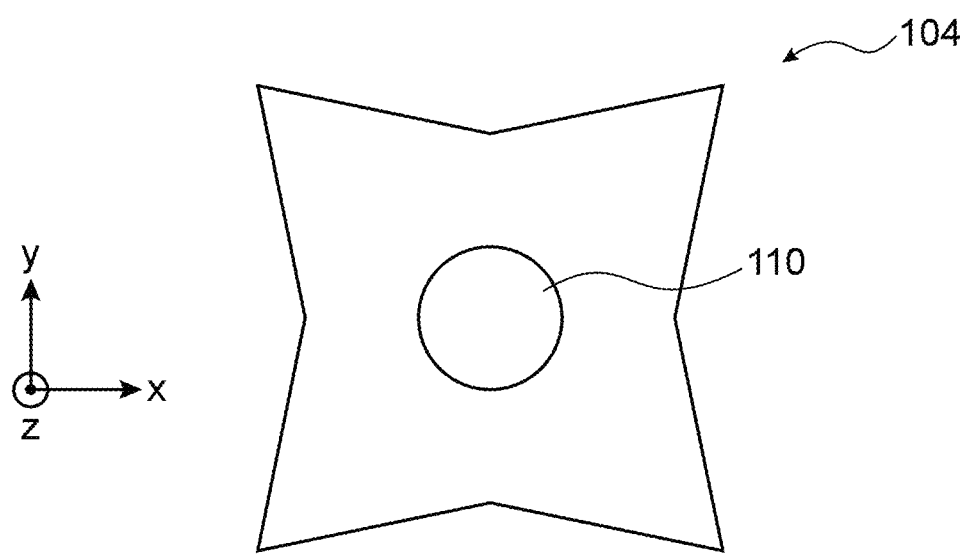

Other configurations of the LED modules 104 can favour the correct orientation of these modules. For example, to avoid a positioning of an LED module 104 such that one of the side faces is arranged on the side of the conductive elements 108, it is possible to etch the LED modules 104 according to a shape such as shown in FIGS. 13A and 13B, that is to say comprising parts etched at the side faces. The upper face of the LED module 104 comprises the contact 110 around which an etching of the insulator has been carried out in part to place this contact in relief. In this way, after dispersion by the spray method described previously, only the face of the bottom of the LED module 104 will have a sufficient adhesion (by Van der Walls forces) to withstand a rinsing (potentially assisted by a little HP). The LED modules 104 that have not adhered to the conductive elements 108 are recycled. In this configuration, it is judicious to disperse a number of LED modules 104 at least 6 times greater than the number of LED modules 104 which is predicted by Poisson's law. A single dispersion of the LED modules 104 is very interesting because a part of the non-determination is lifted because the zones overpopulated with formations of clusters of LED modules 104 will be cleaned of these clusters which cannot attach themselves due to the shape of the LED modules 104.

Figure 14:
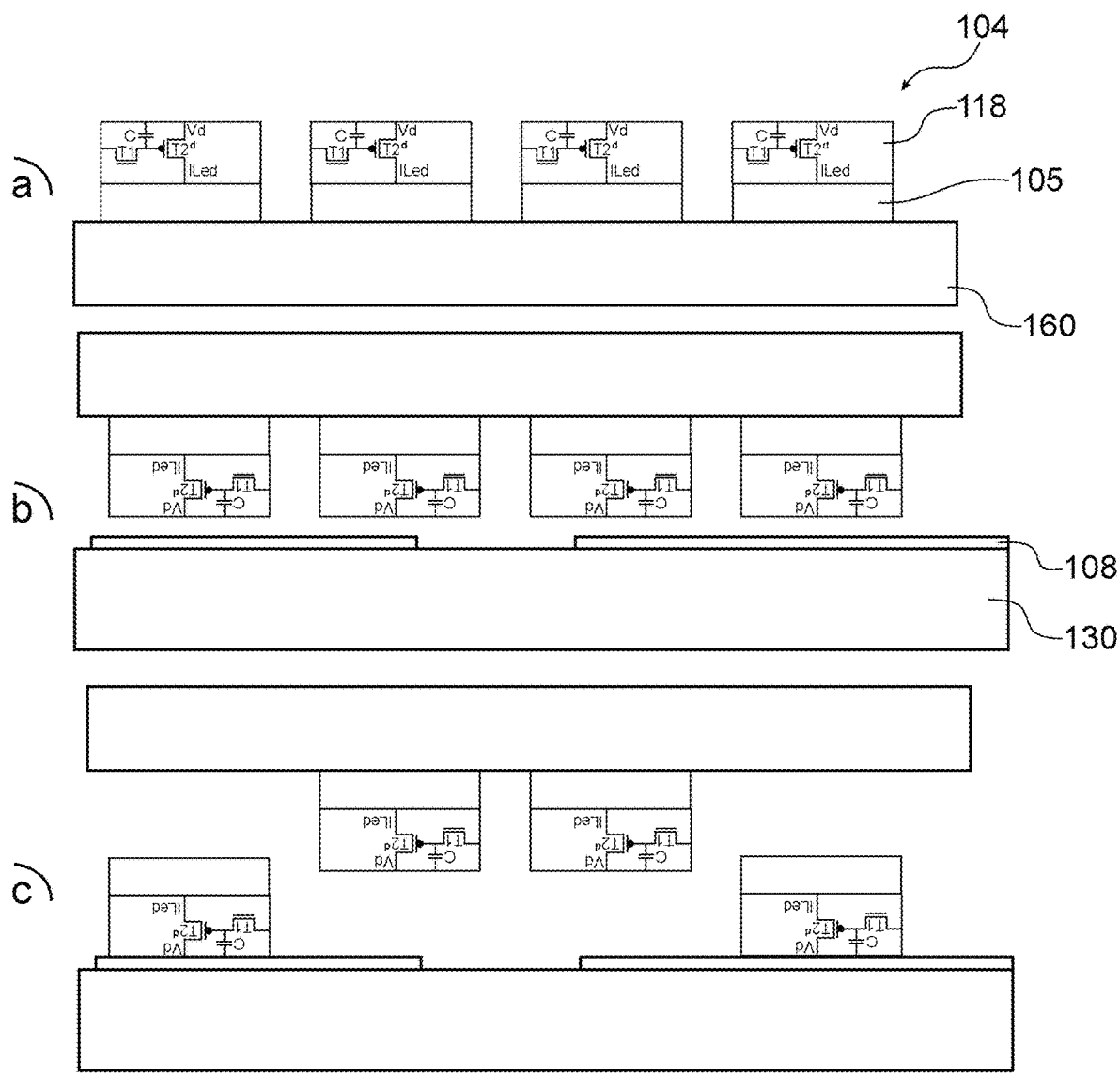
FIG. 14 shows an alternative of transfer of LED modules.

Another manner of dispersing or arranging the LED modules 104 on the host surfaces formed by the conductive elements is shown in FIG. 14.

The LED modules 104 are transferred onto a temporary handle 160, the emissive faces arranged against this handle 160 (FIG. 14, step a)). This assembly is next turned over (FIG. 14, step b)) and a part of the LED modules 104 are detached on the conductive elements 108 (FIG. 14 step c)). The positioning constraints are relaxed on account of the dimensions of the conductive elements 108 which are larger than those of the LED modules 104. The temporary handle could also be in the form of a flexible substrate which could be stretched before being turned over. In this case, the positioning of the LED modules on the host surfaces of the conductive elements 108 will be different from one display device to another, and the positioning of the LED modules on a considered host surface is thus pseudo-random.

In the examples described previously, the dispersion of the LED modules 104 is carried out in a non-deterministic manner for their positioning and potentially in a non-random manner for their orientation when a technique of pre-orientation of the LED modules is implemented. However, the fact of having host surfaces of dimensions much greater than those of the transferred LED modules also makes it possible to implement deterministic transfer solutions, for example via a machine transferring the LED modules 104 onto the host surface, while relaxing the alignment constraints imposed on account of these dimensions. Thus, it is possible to work with larger transfer surfaces than when the LED modules must be transferred onto electrical contacts of size similar to that of the pads of the LED modules. For example, it is possible to work with a transfer machine of which the transfer element (named "stamp") of dimensions 5 cm×5 cm to transfer the LED modules 104 at the pitch of 250 μm, i.e. 50,000 LED modules 104 simultaneously. The positioning of the transfer element with respect to the host surface does not need to be precise (+/−10 μm may suffice), which makes it possible to gain transfer speed and thus a lower cost of the method.

The transfer efficiency is not 100%. To be sure to have at least one LED module 104 (or even 3 modules if three colours per pixel zone with monochromatic LED modules 104 are desired), it would be necessary to create redundancy per display pixel zone. Assuming a transfer efficiency of 99%, if the transfers are doubled then it is possible to reach 99.99% of the pixels having at least one LED module 104. This figure of 99.99% corresponds to the case where the transfer efficiency is independent from one transfer to the other. If the transfer element has a defect locally, there is a dependency from one transfer to the other and in this case the doubling of the transfer steps can only recopy the defect (the same overall efficiency is obtained after a second passage of the transfer element). To offset this potential defect linked locally to a point of reference of the transfer element, the transfer redundancy step may be done with a shift of Nx, Ny display pixel zones (Nx for the number of pixel zones in line, and Ny for the number of pixel zones in column) such that the fixed defects of the transfer element are distributed spatially on the host support.

If there is need to further increase the redundancy to attain better overall efficiency, each passage of the transfer element on a same host zone may be shifted. By targeting an efficiency of 10 defects/$10^6$ display pixel zones, then with a transfer efficiency of 99%, 3 passages of the transfer element on the host surface are sufficient. If the transfer efficiency is 96%, 4 passages may suffice. Typically, the different passages may be shifted by several pixels.

In the device 100 described previously, the LED modules 104 comprise their power supply pads 110, 112 connected to the power supply conductive elements 106, 108 on which the supply voltage is applied to electrically supply the LED modules 104. The only contact pads of the LED modules 104 are the supply pads 110, 112, and the data signals making it possible to drive and command the LED modules 104 must be brought to the LED modules other than by dedicated wire connections. Thus, in this example, the command signals are transmitted to the LED modules 104 through these supply pads 110, 112 and these conductive elements 106, 108 in the form of a modulation signal that the LED modules 104 have to interpret.

Other ways of bringing the command signals of the LED may be envisaged, for example by RF (or even infra) means.

Figure 17:
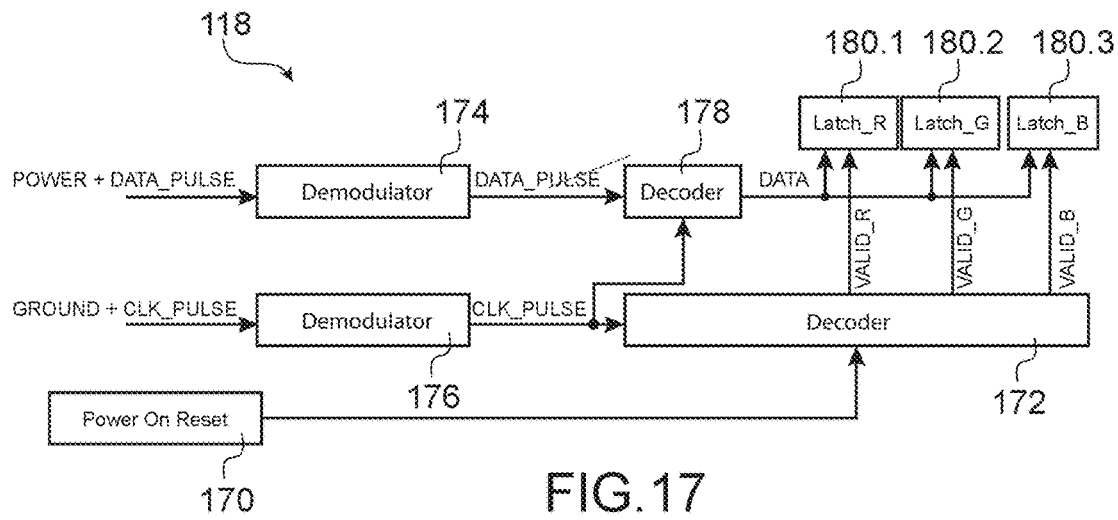
FIGS. 17 and 19 show diagrams of an exemplary embodiment of an electronic command circuit of an LED module.

FIG. 17 shows a block diagram of the functions implemented in the electronic command circuit 118 of each LED module 104 in order to realise the command by PWM (pulse width modulation) or BCM (binary encoded modulation) of an LED 105 of the module from the data and the synchronisation signals transmitted by amplitude modulation of the supply voltage present on a power supply conductor 106, 108.

This block diagram describes an architecture suited to an LED module 104 with 3 channels (RGB) making it possible to carry out the addressing and writing function of a binary datum. The LED module thereby includes 3 LEDs with their respective command switches, similar to the example shown in FIG. 11.

On powering up, a block PoR (Power on Reset) 170 initialises a first decoder 172 named decoder_1 which points at a given instant on one of the three channels, for example on the channel R (red), and initialises, for example at "0", also the RGB data, in three latch type memorisation elements Latch_R, Latch_G and Latch-B.

Demodulators 174, 176 each receive the supply signals from the conductive elements 106, 108 which include the data and synchronisation signals by amplitude modulation respectively of the "POWER" and "GROUND" supply voltages. The data signal is named "POWER+DATA_PULSE" and the synchronisation signal named "GROUND+CLK_PULSE". These demodulators 174, 176 make it possible to extract the variations in power and ground voltages in order to reconstruct the binary signals (named DATA_PULSE and CLK_PULSE).

The signal DATA_PULSE is sent to the input of a second decoder 178, outputting the data signal DATA enabling in fine the command of the LED 105. The signal DATA is memorised in one of the three memory elements 180.1, 180.2, 180.3 used for the 3 RGB channels as a function of the signals coming from the decoder 172, VALID_R, VALID_G, VALID_B. The assembly is synchronised by the decoder 172 which changes the channel selected at each pulse of the clock signal CLK_PULSE via the sending of the signals VALID_R, VALID_G, VALID_B to the memory elements 180.1, 180.2 and 180.3.

Figure 18:
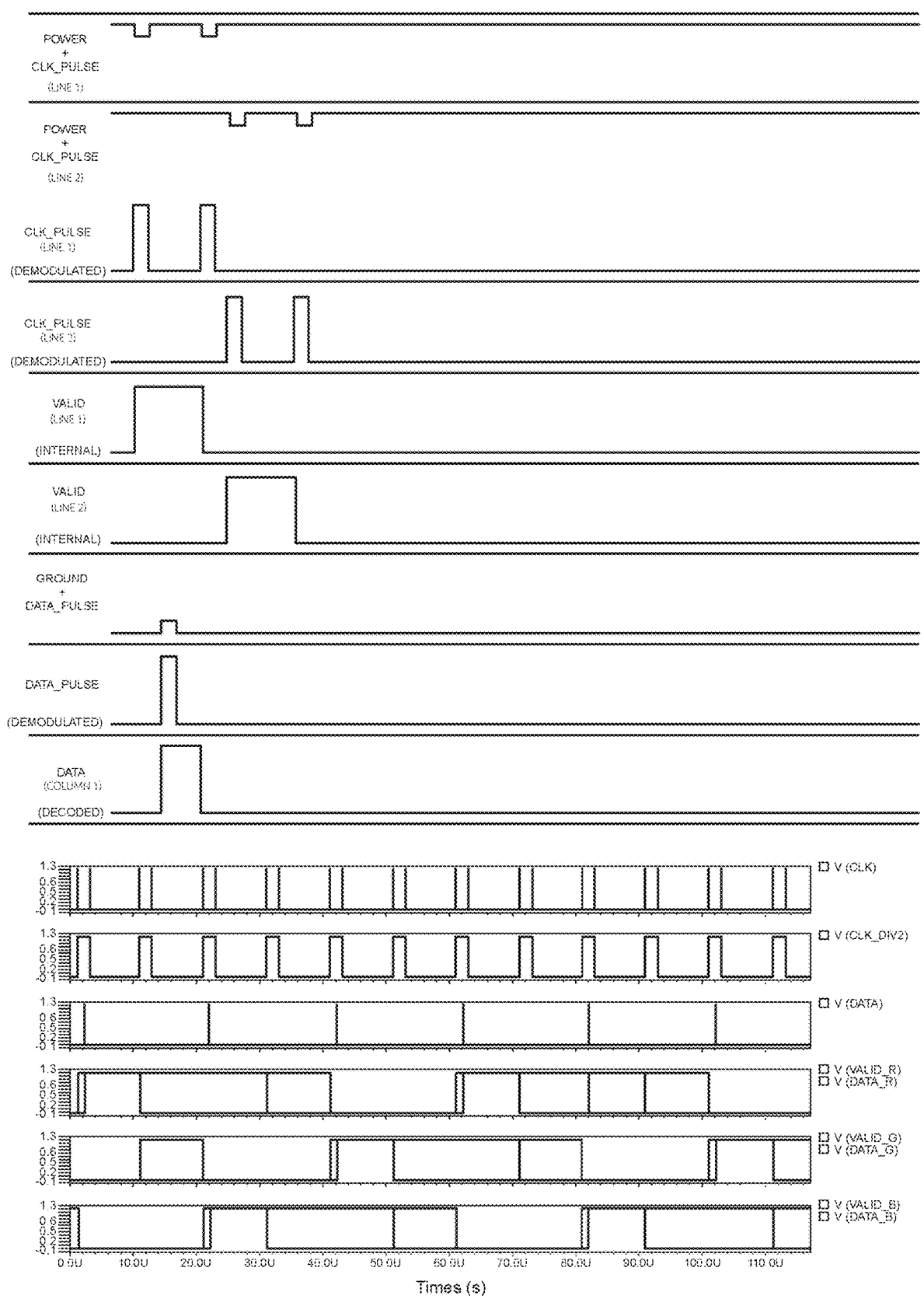
FIG. 18 shows signals obtained during a display by an LED module.

FIG. 18 shows examples of chronograms of signals obtained in this circuit. The sending of 2 pulses on CLK_PULSE makes it possible on the one hand to increment the choice of the RGB channel, then makes it possible to define a time window during which one waits to see if one receives or not a pulse of DATA_PULSE. If yes, then a 1 is for example written in the memorisation element corresponding to the selected channel (R, V or B), if not a 0 is written.

In this example, the value memorised in each memory point of latch type (memorising a single binary value) is used to control directly the command switch of an LED 105 in "all or nothing" mode (the LED being conductive or non-conductive because respectively connected or not connected to the supply voltage).

In order to be able to control the light intensity of an LED 105, it is necessary to drive the conduction and non-conduction time. Thus, the value present in each memory point must be modified in the course of each image frame.

PWM (Pulse Width Modulation) or BCM addressing makes it possible by writing only 1 and 0 to modulate the average luminance emitted by an LED 105 by modulating its ON time: 1=ON, 0=OFF. If the LED 105 is ON throughout the image time, this corresponds to the maximum code, for example on 3 bits: 111. If on the other hand the LED 105 is OFF throughout the image time, then that corresponds to the minimum code: 000.

In this example with 3 addressing bits, the ON or OFF duration associated with the most significant bit (the third) corresponds to four times that associated with the least significant bit (the first), and that associated with the second bit corresponds to two times that associated with the least significant bit. The ON or OFF duration may be encoded by choosing a value comprised between 0 and 7.

Here, the control of the luminosity emitted by the LED, during the display of each image, is carried out by commanding the ratio between the duration during which the LED is ON and the total duration of display of the image on the screen. Such a command of the LED may be obtained using binary words or information, (that is to say a binary code on a certain number of bits making it possible to control the display of the image) of BCM type in which the luminosity of each pixel is encoded in the form of a binary signal. Each bit of such a binary word drives the switching ON or the switching OFF of the LED for a duration proportional to the significance of the bit. For example, the most significant bit (MSB) drives the LED during half of the duration of display of the image (for example 10 ms for a display device operating at a frequency of 50 images/second). The following bit (named MSB-1) represents the quarter of this duration, and so on up to the LSB (Least Significant Bit).

In the case of a matrix type display device such as that described in relation with FIG. 1, it could thereby be provided that each line of pixels is addressed 3 times in the course of a frame, with decreasing time intervals. Thus, the first time interval lasts 4 four times longer than the third interval, and the second time interval lasts 2 times longer than the third time interval. The values memorised in the "latch" memory points in the course of the first, second and third time intervals correspond respectively to the $1^{st}$ bit (most significant), $2^{nd}$ bit and $3^{rd}$ bit (least significant).

In the case where the modules include 3 LEDs, it is then necessary during each addressing of a line to carry out 3 transmissions of information for the 3 channels (values memorised in the respective memory points latch_R latch_G and latch_B). It is thereby possible to envisage addressing successively the 3 channels of the pixel module by sending 6 pulses on CLK_PULSE and applying or not 3 pulses of DATA_PULSE according to the code to apply.

Such a protocol offers the advantage of having a very compact architecture, which is extremely advantageous because this makes it possible to produce LED modules 104 with small dimensions.

In this protocol, a demodulation error may lead to an error of selection of channel or a written data error. If the datum is false, the consequence is limited because one-off, conversely an error on the detection of the CLK_PULSE causes an error on the time window and an error on the addressed channel. In this case a re-initialisation by the Power On Reset is necessary.

In order to improve the robustness of the circuit 118, it is possible to place a binary decoder at the output of the demodulators 174, 176 to be certain of addressing the R, G, or B channel individually instead of using a chaser (cycled sequencer). This requires however more surface and necessitates the transmission of more data (of which a complex tag which makes it possible to know what channel is addressed).

Figure 19:
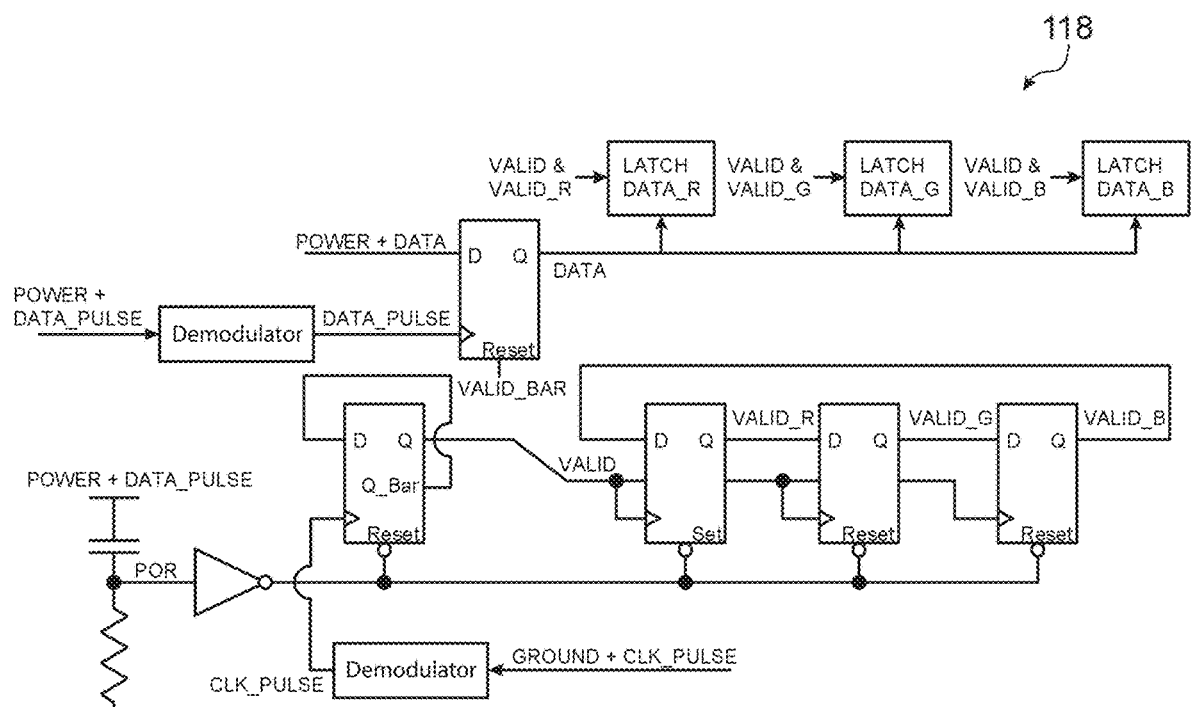

An exemplary embodiment of the circuit 118 implementing the functions of the block diagram of FIG. 17 is shown in FIG. 19.

Other embodiments of an electronic control circuit present in the LED module may be envisaged. It could be possible for example to replace each unitary memorisation element (latch) by a memorisation element of several bits, of register type in order to memorise in each register the numerical value, for example on 3 bits as previously, corresponding to the desired light intensity. In this case, it is not necessary to provide 3 line addressings in the course of the frame, but a single line addressing that makes it possible to convey the value of the 3 bits. It will thereafter be necessary to add between each register and the command switch of the corresponding LED a command circuit, to convert the binary value into a temporal command signal of the LED. An advantage of such an alternative embodiment is that it makes it possible to envisage updating the register values only when it is desired to modify the light intensity, thereby enabling a reduction in energy consumption. Moreover, associated with a device for identifying LED modules such as described hereafter, it is possible to envisage architectures other than matrix architectures.

After the production of the device 100, and before its use, when the LED modules 102 have been distributed randomly on the host support, the number of LED modules 104 per display pixel zone 102 being unknown, a first calibration phase makes it possible, through the reading of the consumption when the LED 105 of a display pixel zone 102 are ON, to determine their number. Knowing the number, the display codes are adapted in an inversely proportional manner to arrive at the initially desired luminosity.

Other approaches for calibrating the display device 100 are possible, such as for example the adjustment of the current or the adjustment of the voltage of the display pixel zones 102 containing the n LED modules 104. It is also possible to envisage a visual detection to determine the position, the colour and the number of LED modules 104 per display pixel zone 102.

Thanks to this calibration, each display pixel zone 102 operates in the same way whatever the number of LED modules 102 in each of the zones 102.

In an alternative, this calibration may be carried out via an identification of the LED modules 104. The process of communication using an identification of the LED modules can be done in different ways, by wired or wireless means (for example RF communication).

Prior to the use of a method of communication with identification of modules, each LED module must receive an identifier. This "personalisation" of each LED module may be achieved by action on a hardware component: by flashing a rom, by burning out fuses to assign a code to each LED module 104, or may be carried out by programming of an LED module 104.

During a communication procedure with identification it is also possible to exploit the statistical properties to identify the LED modules 104 without them having a unique identification code. This makes it possible to reduce the number of identification bits to memorise and greatly reduces the complexity of the LED modules 104.

To do so, "n" LED modules 104 having different identification codes are produced and distributed randomly to produce the device 100. Each display pixel zone 102 has one or more LED modules 104 which have an address among "n". During a communication with the LED modules 104 of a display pixel zone 102, an inventory of the LED modules 104 is carried out by scanning the n address codes in order to know their number and identify the addresses of the LED modules having replied present. Thus, it is possible to switch off the redundant LED modules 104 and only keep one active LED module 104 per display pixel zone. By this means, there is no longer any adjustment to be made (voltage/current/binary code) in order to have a homogeneous display on the whole display because there is only a single LED module 104 per display pixel zone 102.

The identification may be carried out using software. Thus, it is possible to communicate with the display pixel zones 102 in the manner of a computer on the internet network sending requests and obtaining a unique address on the network. This requires a communication protocol, digital electronic elements and a memory.

An advantage of the individual addressing of the LED modules 104 is that it is possible to change the method of writing in the display device 100. Indeed, instead of scanning all the lines in turn while having to refresh the data present on the column bus in order to display an image, if the pixels have a specific address, then it is possible to only address the pixels that have changed from one image to the next, which makes it possible to obtain a very low consumption of the device 100.

The identification by address (individual or not) offers the possibility of deactivating certain LED modules 104, this makes it possible to exploit the redundancy. In the event of failure or too important dispersion of an LED module 104, it is possible to deactivate it and to select another thereof (if there is one thereof) situated in the same display pixel zone 102.

In the exemplary embodiments described previously, the command electronic of the LEDS 105 is integrated in the LED modules 104. In an alternative or as a complement, it is possible that electronic command circuits are present under the host support of the device 100 to which the LED modules 104 are connected, for example made using CMOS technology. In this case, it is the bare LEDs that are transferred.

Figure 20:
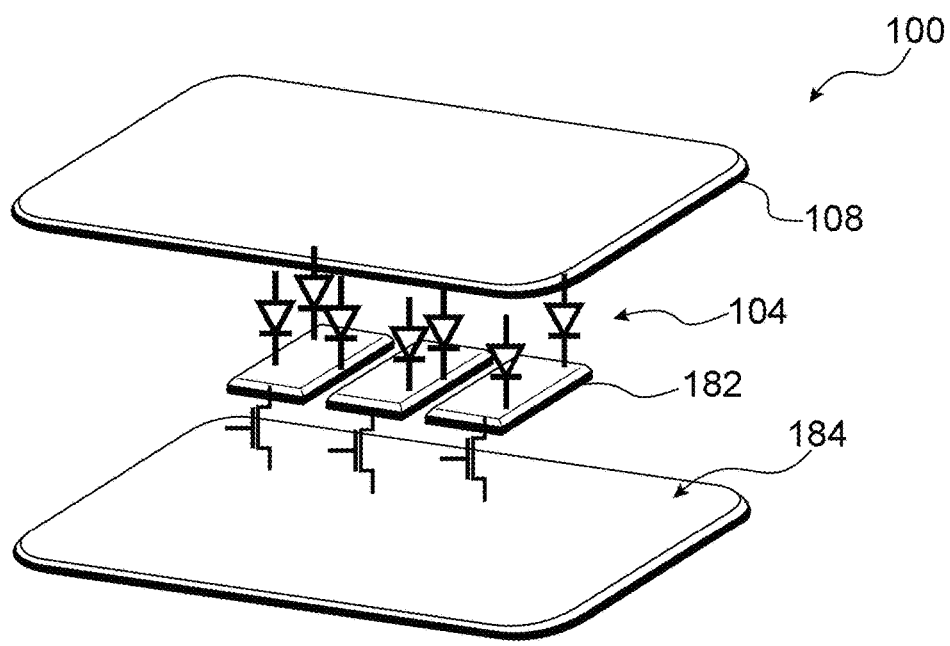
FIG. 20 schematically shows a display device including the zones differentiated by colour to display.

The host support may be structured according to differentiated zones each intended to receive LED modules 104 suited to the emission of a single colour red, green or blue. This relaxes the constraint of deposition of the LED modules 104 because it is possible to resort to a stencil for the deposition of the LED modules 104 associated with each of these colours and makes it possible to keep a conventional display architecture by bonding on the rear face of the host support a large surface MOS type command electronic of TFT, Poly-Si type. FIG. 20 schematically shows such a configuration in which host zones 182 differentiated for the different colours are produced for the arrangement of the LED modules 104. The command electronic present on the rear face is referenced 184.

Alternatively to TFT technology for producing the command electronic 184, it is possible to use a glass plate and to bond MOS control modules against this plate to address the display pixel zones 102.

After the deposition of the RGB modules, it is possible to communicate with the desired module or impose a configuration (for example by laser which burns up the fuses) in order to force one of the modules to only display one of the desired colours. This combined with a structuring of the power supply conductive elements makes it possible to have a display device 100 of large surface and potentially reconfigurable on a large TFT type technical surface while only manufacturing/depositing a single type of RGB module.

A controller can manage the supply signals, the currents or the voltages of several display pixel zones each producing a RGB light emission. This controller can receive its data by wire or RF link, and distribute the information per display pixel zone. This solution offers the advantage of having a very small CMOS controller compared to the surface occupied by the controlled display pixel zones.

Different embodiments of the display device 100 in which the LED modules 104 communicate by RF signals will now be described.

Figure 21:
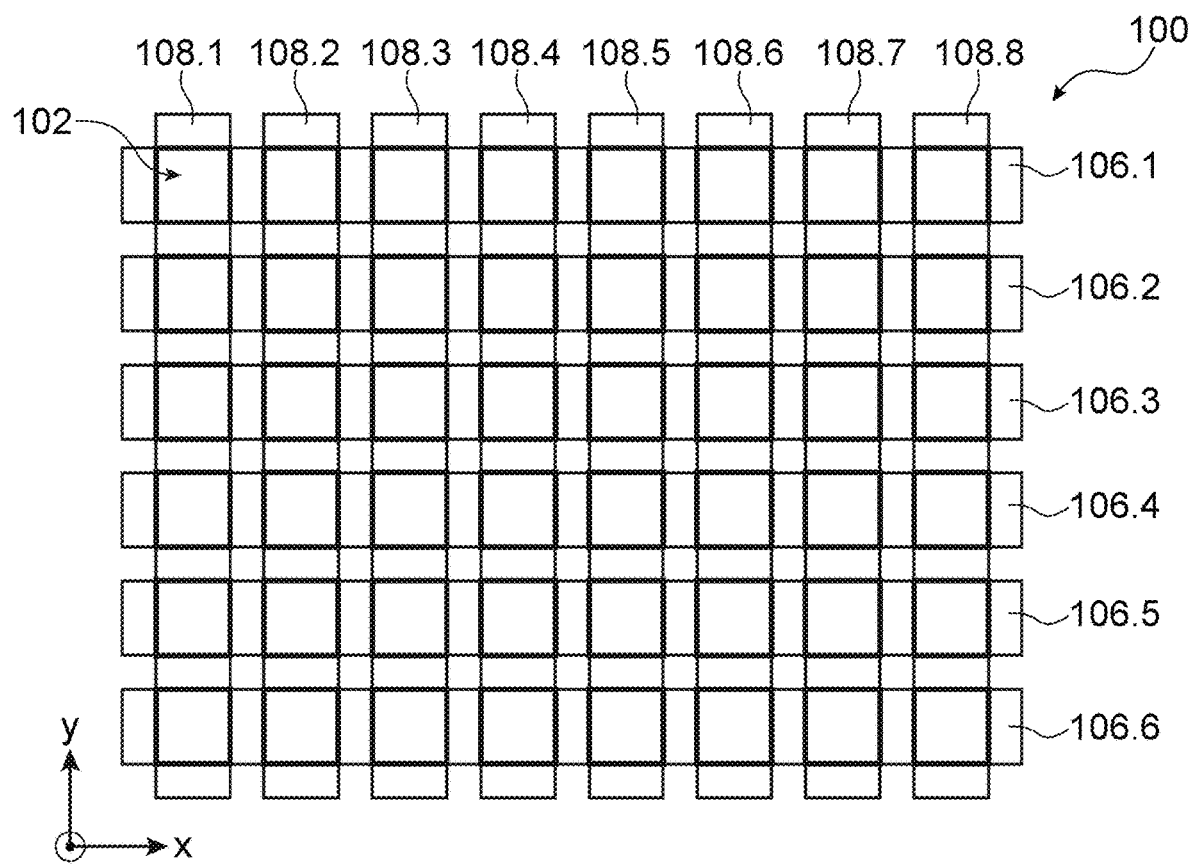
FIG. 21 schematically shows a part of a display device in which the LED modules communicate by RF signals.

Reference is firstly made to FIG. 21 which schematically shows a part of such a display device 100.

This device 100 comprises a display plane on which one or more images are intended to be displayed. This display plane is divided into several display pixel zones 102 controlled independently of each other.

Each display pixel zone 102 comprises one or more LED modules 104. Each LED module 104 comprises at least one LED 105, which is here a μLED. The LEDs 105 each include a p-n junction formed by layers of GaN and/or InGaN and/or AlGaN.

Figure 22:
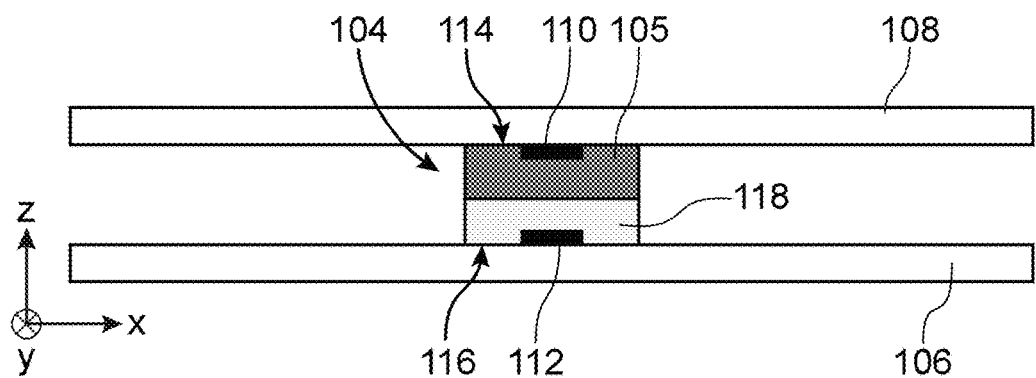
FIGS. 22 and 23 schematically show an LED module communicating by RF signals.

The LED modules 104 are interposed between two power supply conductive elements 106, 108 (referenced 106.1 to 106.6 and 108.1 to 108.8 in FIG. 21), and each LED module 104 comprises two power supply pads 110, 112 arranged at two opposite faces 114, 116 of the LED module 104 of which one corresponds to an emissive face of the LED 105 of said LED module 104 and connected respectively to one and the other of the two power supply conductive elements 106, 108 on which are applied a supply potential (on the element 106 in this example) and a reference potential (on the element 108 in this example). This configuration of one of the LED modules 104 may be seen in FIG. 22. In this example, the emissive face of the LED 105 corresponds to the face 114 that is located on the side of the conductive element 108.

As an example, the conductive element 108 which is arranged against the emissive face of the LEDs 105 may comprise a transparent conductive material such as ITO.

In FIG. 21, the power supply conductors 106, 108 are produced in the form of conductive tracks arranged perpendicularly to each other. In the embodiment described here, each intersection of one of the conductive elements 106 laid out in lines with one of the conductive elements 108 laid out in columns defines a display pixel zone. This layout thereby forms a matrix of display pixel zones 102. Moreover, by commanding the LED modules 104 such that the LED module(s) 104 of each zone 102 from a same signal, that is to say such that they display a light signal forming a same image point, each pixel zone 102 thus corresponds to a pixel of the display plane of the device 100.

Here, each LED module 104 also comprises a command circuit 118. This command circuit 118 comprises electronic elements making it possible to command the light emission produced by the LED 105 of the module 104 while outputting to the LED 105 a signal representative of the light signal to emit.

Figure 23:
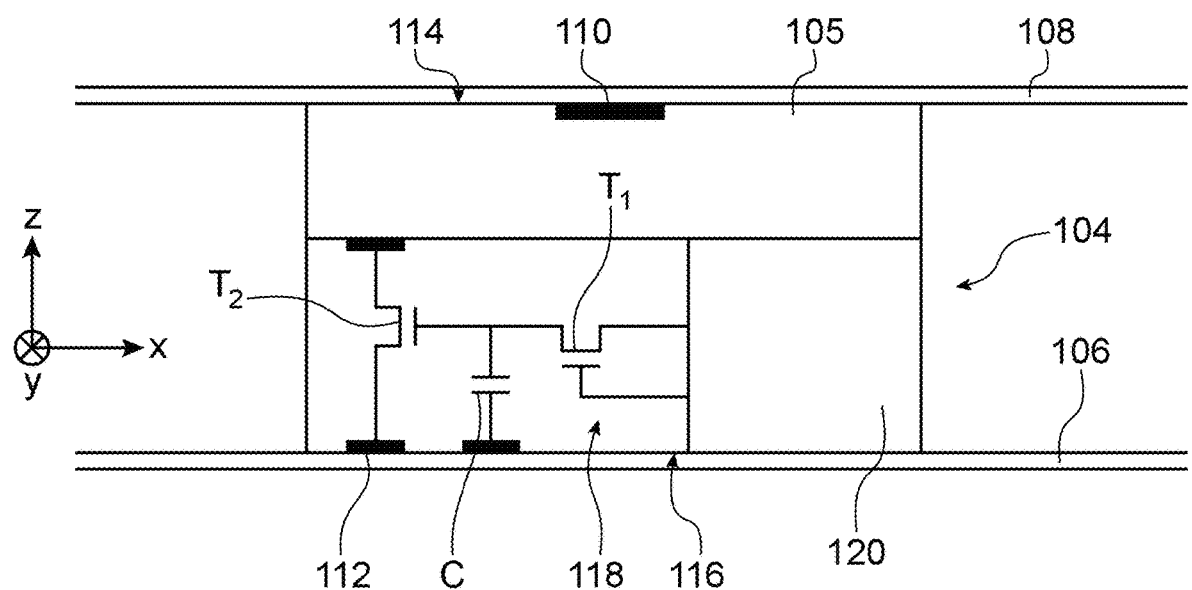

An exemplary embodiment of such a command circuit 118 is shown schematically in FIG. 23. This circuit 116 comprises a first transistor T1 serving to command the switching on or the switching off of the LED 105, a transistor T2 making it possible to inject the desired current into the LED 105 and a storage capacity C making it possible to maintain the desired voltage on the gate of the transistor T2. A voltage Vdd coming from the conductive element 106 is applied on the drain of the transistor T2 from the power supply pad 112 of the LED module 104 in contact with the conductive element 106. The current outputted by the transistor T2 is applied on one of the layers of the p-n junction of the LED 105. The other layer of the p-n junction of the LED 105 is subjected to the electrical potential transmitted by the conductive element 108 via the power supply pad 110.

Command signals are transmitted to the command circuit 118 from a control device 120. In this embodiment, each LED module 104 comprises a control device 120 intended to control the light signal intended to be emitted by this LED module 104. The control device 120 may include electronic circuits such as a memory, a received message decoder, a unit for sequencing the commands to apply by the command circuit 118, etc. The control device 120 is advantageously supplied via connections connected to the conductive elements 106 and 108.

Next, the device 100 comprises an input/output interface capable of receiving in input an image signal $S_{image}$ intended to be displayed by the device 100. This input/output interface includes one or more command units 122, shown in FIG. 24, which, from the image signal $S_{image}$ or from a part of this signal $S_{image}$, determine the command signals to send to the different display pixel zones 102 so that the LEDs 105 emit light signals corresponding together to the image signal $S_{image}$.

Unlike conventional screens in which these command signals are transmitted from the element of the screen receiving the image signal to display on the screen up to the command circuit of each pixel through wired connections, the or each of the command units 122 of the device 100 transmit the command signals of the display pixel zones 102 to the control devices 120 by RF waves, wireless, via at least one first antenna 124. These command signals are received by second antennas 126 each coupled to one of the control devices 120. Thus, in the embodiment described here, due to the fact that each LED module 104 is provided with its own control device 120, each LED module 104 comprises an antenna 126 making it possible to receive the command signal that will make it possible, after a processing carried out by an RF signal processing circuit included in the control device 120, to obtain the desired light emission for the LEDs 105 of this LED module 104 (see the diagram of FIG. 24).

Generally speaking, the command signals propagated by RF means may include different types of information, for example an identifier of the addressee control device 120 or a desired level of luminosity for an addressee display pixel zone 102. The command signal may also include a sequence, temporal, of desired levels of luminosity. The information transiting by RF means may optionally be encoded. The addressee control device 120 could, if need be, decode the information and thereafter drive the command circuit so as to obtain the desired level of luminosity, or the desired sequence. The information on the desired level(s) of luminosity may be memorised in a memory of the control device 120 and this information can, for example, be updated uniquely in the event of a need to change the desired luminosity values.

Figure 24:
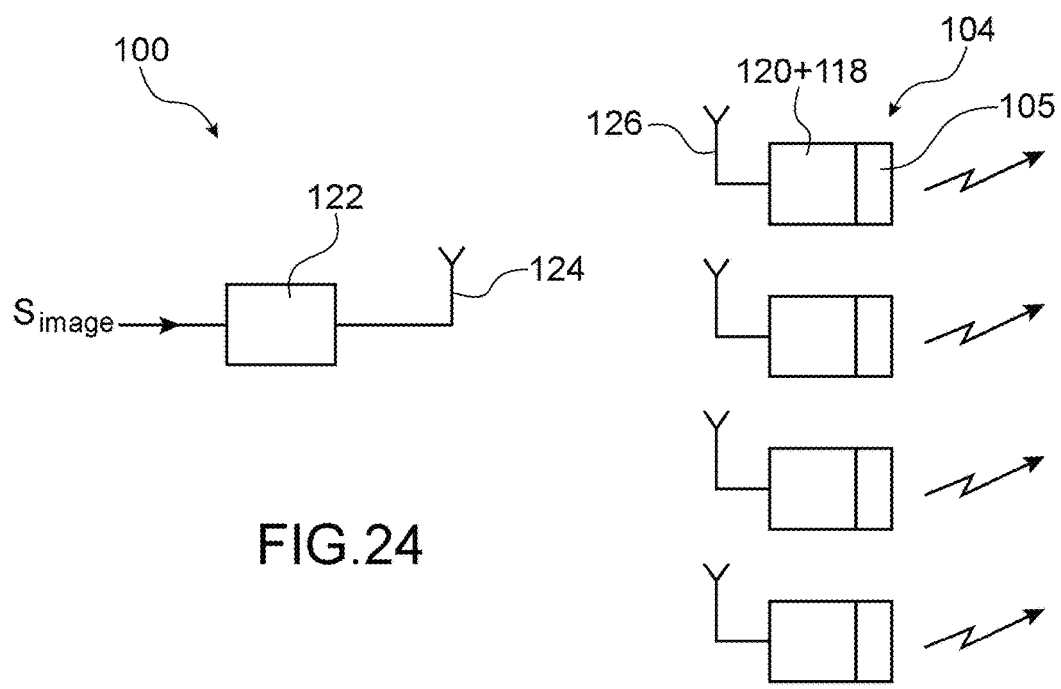
FIG. 24 schematically shows the elements carrying out a transmission of signals by RF waves within the display device.

Although in FIG. 24 a single antenna 124 is shown, it is possible to have several command units 122 each connected to an antenna 124 and intended to transmit by RF the command signals of a part only of the display pixel zones of the device 100. It is for example possible to have several command units 122 each connected to a distinct antenna 124, these command units and these antennas 124 being spaced apart by a distance equal to around 300 μm, with each of these command units 122 and these antennas 124 managing the RF transmissions within the device 100 in a region forming a square of dimensions 300 μm×300 μm.

In the embodiment described above, each display pixel zone 102 comprises an LED module 104 comprising for example an LED 105 of monochromatic type. In an alternative, the LED module 104 could include 3 LEDs, for example RGB, for Red/Green/Blue.

In an alternative, each display pixel zone 102 may comprise several LED modules 104 intended to display the same light signal.

In an alternative, each display pixel zone may comprise several monochromatic LED modules 104 and for example at least three LED modules 104 capable of emitting respectively the colours red, green and blue. In this case, the light signals emitted by each of the monochromatic diodes of different colours may be defined from a same command signal (which can require a same level of current in all the LEDs or require different current levels in the LEDS) or from different command signals intended for each of the LED colours of the display pixel zone.

In the embodiment described above, each of the LED modules 104 comprises a control device 120 coupled to an antenna 126.

Figure 25:
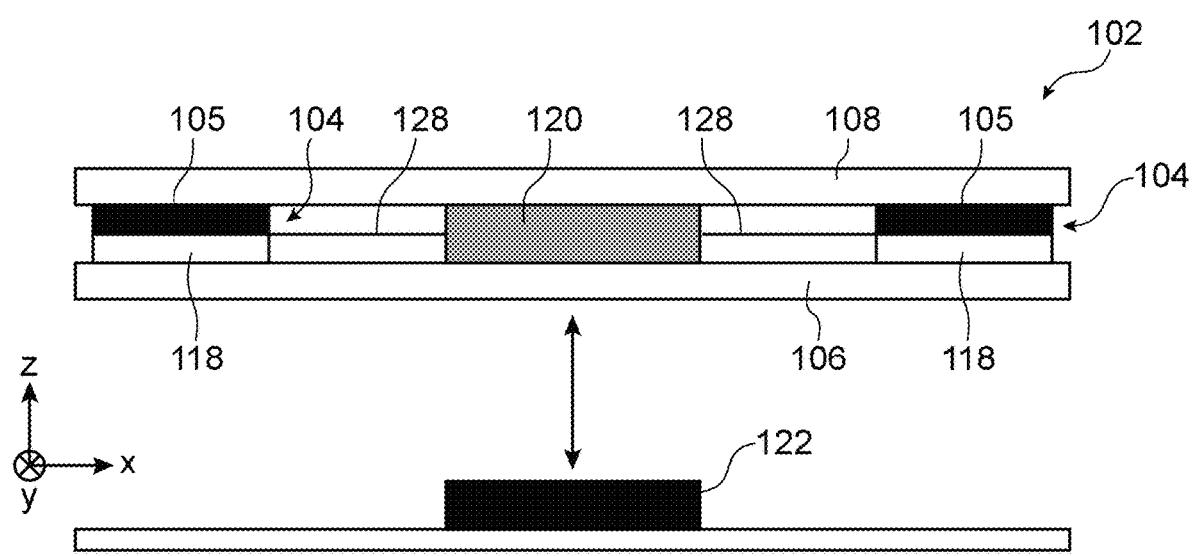
FIG. 25 schematically shows a part of the display device according to another embodiment.

According to another embodiment, it is possible that each control device 120, as well as each antenna 126, is associated with several LED modules 104. In FIG. 25, a display pixel zone 102 of the device 100 is shown. This zone includes several LED modules 104 coupled in a wired manner (wire referenced 128) with a control device 120 common to these different modules 104. The command unit 122 associated with this zone 102 thus sends the different command signals of these LED modules 104 by RF transmission to the control device 120 which next transmits it by wired connections to the modules 104.

In the example shown in FIG. 25, the control device is arranged between the conductive elements 106, 108, like the LED modules 104.

This other embodiment is for example used when the density of the LED modules 104 does not enable each LED module 104 to have its own antenna 126, notably on account of the dimensions of these antennas 126 imposed by the characteristics of the transmitted signals.

Moreover, the control device 120 can drive the LED modules 104 from the signals received on the second antenna even when the LED modules do not include command circuits.

Figure 26A:
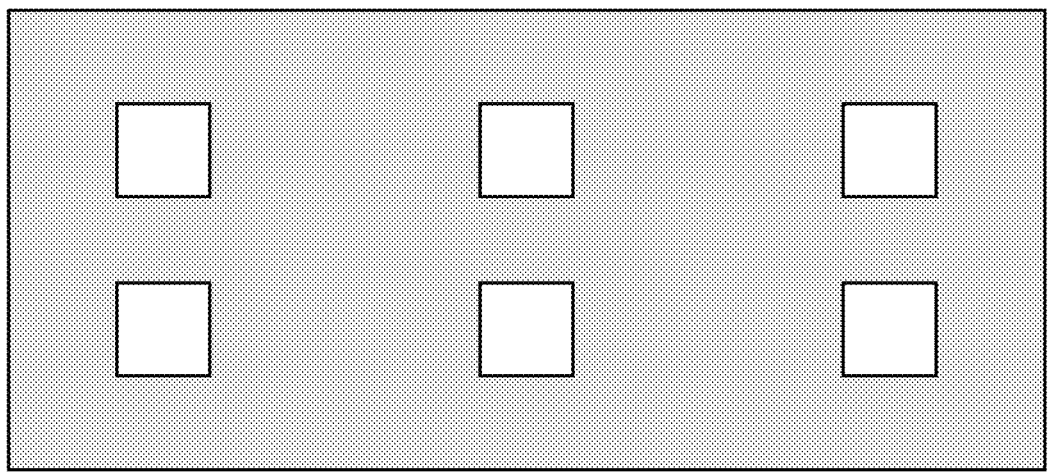
FIGS. 26A and 26B show diagrams of RF antennas used in a display device.
Figure 26B:

In the embodiments described above, the antennas 126 may be arranged in a same plane as one of the two conductive elements 106, 108 (in a same plane as the conductive element 106 in the exemplary embodiments described previously). In this case, the antennas 126 may be produced in the form of planar antennas, or "patch", apertured (example shown in FIG. 26A) or in the form of spaced apart lines (example shown in FIG. 26B).

Figure 27:
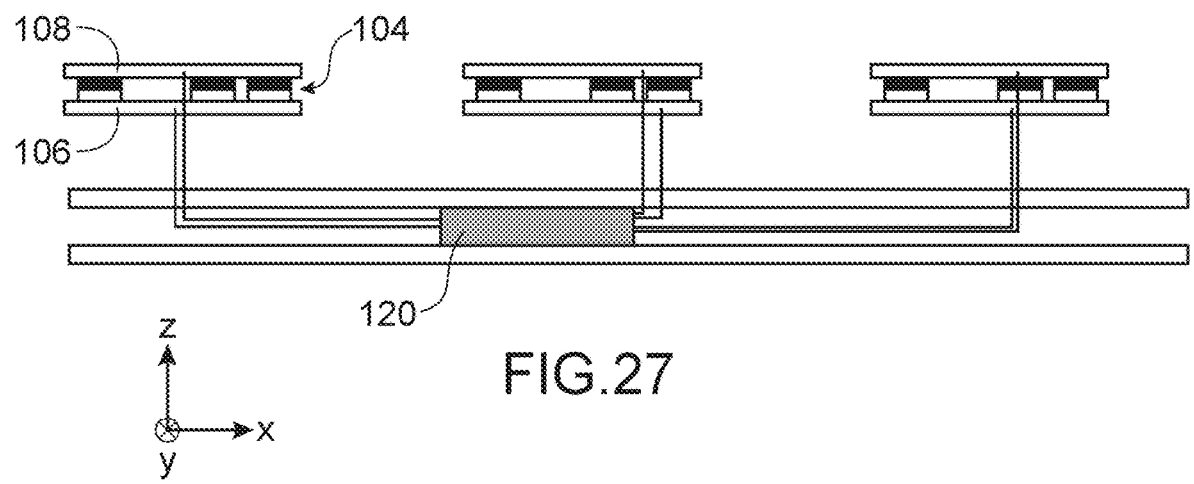
FIG. 27 schematically shows a part of the display device according to another embodiment.

According to another embodiment shown in FIG. 27, it is also possible to have the control devices 120 which are not arranged in the display plane with the LED modules 104, but which are arranged behind this display plane, with in this case wired links between these control devices 120 and the LED modules 104.

According to an alternative embodiment, it is possible that the LED modules 104 are not supplied electrically through the conductive elements 106, 108, but are remotely supplied using for example a RFID or NFC type communication.

In the exemplary embodiments described previously, the conductive elements 106, 108 each correspond to several conductive tracks extending along different directions. In an alternative, it is possible that the conductive elements 106, 108 each correspond to a conductive plane common to all the LED modules 104 or common to a sub-assembly of LED modules 104 of the device 100.

The RF communications described previously may resort to identification codes associated with each LED module 104 or with groups of LED modules 104, for example those of a same display pixel zone 102.

Figure 28:
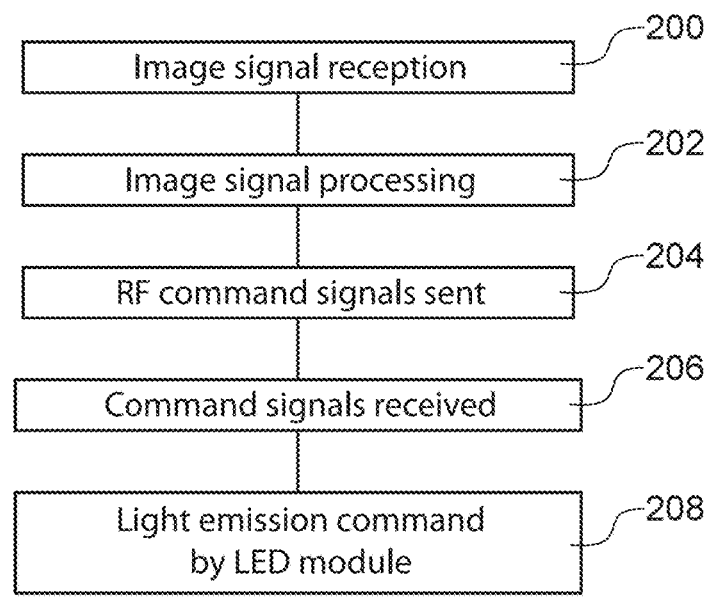
FIG. 28 shows a diagram of a method for displaying an image according to a particular embodiment.

An organisation chart of the display method implemented by the device 100 is shown in FIG. 28.

At a step 200, the image signal intended to be displayed on the display plane of the device 100 is received by the device 100 via its input/output interface.

At a step 202, the image signal received is processed by the command unit(s) 122 which determine the command signals to send to the different display pixel zones 102 of the device 100.

At a step 204, the command signals calculated by the command unit(s) 122 are sent to the display pixel zones 102 by RF waves via the antenna(s) 124.

At a step 206, the command signals are received, via the antenna(s) 126, by the control device(s) 120 present in each display pixel zone 102 addressed by the command unit(s) 122.

At a step 208, the LED modules 104 are then commanded by the control devices 120 to display the light signals corresponding to the command signals that have been transmitted to them.

Those skilled in the art could envisage other embodiments of the present invention. Among other things, although the embodiments described previously include LED modules each arranged between two conductive supply elements, it is entirely possible to envisage a display device in which the two conductive elements are positioned on a same substrate, on the same side of the LED modules (an exemplary embodiment of such a display device is described in the French patent application FR 3 044 467 A1).

The invention claimed is:
1. A display device, comprising at least:
a support;
first and second power supply conductive elements, at least one said first conductive element being arranged on a face of said support;
several LED modules each comprising at least one LED, each LED comprising at least two layers forming a p-n junction, and each LED module including two power supply pads arranged respectively on two opposite faces of the LED module of which one of the two opposite faces of the LED module corresponds to an emissive face of the LED of said LED module, wherein the power supply pads of each LED module are connected respectively to the first and second power supply conductive elements, for a power supply of the LED module, and a ratio of dimensions between a host surface of a display pixel zone, in which one or more LED modules belonging to the display pixel zone are to produce a display of a light point of the display device and formed by the first conductive element, and a connection surface of a power supply pad of one of the LED modules with the first conductive element is greater than or equal to 2.

2. The display device according to claim 1, wherein the LED modules are distributed in a random manner, such that a density of LED modules on the host surface is non-uniform.

3. The display device according to claim 1, wherein each LED module further comprises a command circuit of the LED of said LED module, the command circuit configured to output, on one of layers of the p-n junction of the LED, a signal representative of a light signal to be emitted by the LED.

4. The display device according to claim 3, wherein the command circuits are configured to carry out a demodulation of a binary signal representative of a light signal to be transmitted on the power supply conductive elements.

5. The display device according to claim 4, wherein the demodulation is of PWM or BCM type.

6. The display device according to claim 1, wherein each of the first and second power supply conductive elements comprises several conductive tracks extending substantially parallel with each other, the conductive tracks of the first power supply conductive element extending substantially perpendicularly to the conductive tracks of the second power supply conductive element.

7. The display device according to claim 1, wherein each of the first and second power supply conductive elements comprises a single electrically conductive layer.

8. The display device according to claim 1, in which wherein each LED module comprises two LEDs arranged head-to-tail a first of said two LEDs being arranged next to a second of said two LEDs.

9. The display device according to claim 1, further comprising:

a display plane including several display pixel zones, each display pixel zone including at least one of the LED modules and a control device of said at least one of the LED modules of said display pixel zone as a function of a command signal of said display pixel zone to be received by the control device; and an input and output interface of the display device, configured to receive an image signal to be displayed on the display plane and including at least one command unit to output the command signals of the display pixel zones, wherein the command unit is connected to at least one first antenna configured to transmit by RF waves the command signals of the display pixel zones, and each control device includes at least one second antenna coupled to an RF signal processing circuit and is configured to receive the command signal of said display pixel zone and of commanding said at least one of the LED modules of the display pixel zone as a function of the command signal received to emit a light signal corresponding to a part of the image signal associated with said display pixel zone.

10. The display device according to claim 1, wherein the LED modules are distributed in a random or quasi-random manner on the host surface of the first conductive element.

11. A method for producing a display device, comprising at least:

producing several LED modules each comprising at least one LED and at least two power supply pads arranged at two opposite faces of the LED module of which one of the two opposite faces of the LED module corresponds to an emissive face of the LED of said LED module;

producing a host support with at least one first power supply conductive element arranged on a face of the host support;

transferring the LED modules onto the host support such that the first power supply conductive element forms, for at least one part of the LED modules, at least one host surface of a display pixel zone in which one or more LED modules belonging to this zone are to produce a display of a light point of the display device, against which one of the power supply pads of each of said LED modules is arranged to produce an electrical contact, a ratio of dimensions between said host surface and a connection surface of a power supply pad of one of the LED modules with the first conductive element is greater than or equal to 2; and producing at least one second power supply conductive element on the LED modules such that the LED modules are arranged between the first and second power supply conductive elements and that the two power supply pads are connected respectively to the first and second power supply conductive elements.

12. The method according to claim 11, in which wherein, during the step of transfer of transferring the LED modules, a positioning of the LED modules is carried out in a random or quasi-random manner on said at least one host surface of the first conductive element.

13. The method according to claim 12, wherein a dispersion of the LED modules on the host support is random and comprises a projection by spray of the LED modules, or a suspension of the LED modules in a solution then a sedimentation of the LED modules on the host support and a removal from a medium of the solution in which the LED modules have been dispersed.

14. The method according to claim 12, wherein the transfer of the LED modules is implemented in a pseudo-random manner using a transfer machine capable of transferring simultaneously several LED modules onto a part of the host support.

15. The method according to claim 11, wherein a production of each of the first and second power supply conductive elements comprises the deposition by printing of several conductive tracks extending substantially parallel to each other, the conductive tracks of a first of the two power supply conductive elements extending substantially perpendicularly to the conductive tracks of a second of the two power supply conductive elements.

16. The method according to claim 11, further comprising, between the transfer of the LED modules and a production of the second power supply conductive element:

depositing a photosensitive resin covering the LED modules and parts of the host support located on a side of the LED modules and not covered by the LED modules;

exposing the photosensitive resin through the host support which is transparent vis-a-vis a wavelength used for this exposure;

developing the photosensitive resin which has been exposed such that remaining parts of the photosensitive resin which has been exposed are kept between the LED modules and form passivation elements between the LED modules.

17. The method according to claim 11, wherein the LED modules are produced such that
each LED module comprises at least one micro-magnet, side faces of the LED modules are etched, or
each LED module comprises at least one micro-magnet and the side faces of the LED modules are etched.

18. The method according to claim 17, wherein the LED modules are produced such that during a dispersion of the LED modules on the host support, an arrangement of the LED modules such that the emissive face of the LED is arranged on one side of the host support which is optically transparent is favored.

* * * * *